US012772737B2

(12) United States Patent
Zhu et al.

(10) Patent No.: US 12,772,737 B2
(45) Date of Patent: Oct. 20, 2026

(54) ACOUSTIC DEVICES

(71) Applicant: SHENZHEN SHOKZ CO., LTD., Shenzhen (CN)

(72) Inventors: Guangyuan Zhu, Shenzhen (CN); Lei Zhang, Shenzhen (CN); Xin Qi, Shenzhen (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 991 days.

(21) Appl. No.: 17/932,303

(22) Filed: Sep. 15, 2022

(65) Prior Publication Data

US 2023/0320221 A1 Oct. 5, 2023

Related U.S. Application Data

(63) Continuation of application No. PCT/CN2022/084935, filed on Apr. 1, 2022.

(51) Int. Cl.

*H01L 41/047* (2006.01)
*H04R 17/00* (2006.01)

(Continued)

(52) U.S. Cl.

CPC ......... *H10N 30/2042* (2023.02); *H04R 17/00* (2013.01); *H10N 30/50* (2023.02); *H10N 30/872* (2023.02); *H04R 2217/01* (2013.01)

(58) Field of Classification Search

CPC ............... H10N 30/2042; H10N 30/50; H10N 30/872

(Continued)

(56) References Cited

U.S. PATENT DOCUMENTS 4,647,881 A 3/1987 Mitsutsuka
6,147,439 A 11/2000 Takagi et al.

(Continued)

FOREIGN PATENT DOCUMENTS

CN 101620642 A 1/2010
CN 102143424 A 8/2011

(Continued)

OTHER PUBLICATIONS

Communication Pursuant to Article 94(3) EPC in European Application No. 22769068.2 mailed on Apr. 8, 2025, 7 pages.

(Continued)

*Primary Examiner* — Derek J Rosenau
(74) *Attorney, Agent, or Firm* — METIS IP LLC

(57) ABSTRACT

The embodiment of the present disclosure may disclose an acoustic device. The acoustic device may comprise a piezoelectric component, an electrode, and a vibration component. The piezoelectric component may generate vibration under an action of a driving voltage, the electrode may provide the driving voltage for the piezoelectric component, and the vibration component may be physically connected to the piezoelectric component to receive the vibration and generate sound. The piezoelectric component may include a substrate and a piezoelectric layer, the piezoelectric layer may be covered on a surface of the substrate, the electrode may be covered on a surface of the piezoelectric layer, and the coverage area of the electrode on the surface of the piezoelectric layer may be less than an area of the surface of the substrate covered with the piezoelectric layer. In the present disclosure, the modal actuator of the piezoelectric component may be formed through the electrode designing, so that the piezoelectric component may output a specific modal shape, and improves the acoustic characteristics of the acoustic device. Compared with the modal control (Continued)

system composed of different mechanical structures added in a specific region, the present disclosure realizes the modal control of the piezoelectric component through the electrode design, which may simplify the structure of the acoustic device.

19 Claims, 23 Drawing Sheets

(51) Int. Cl.
*H10N 30/20* (2023.01)
*H10N 30/50* (2023.01)
*H10N 30/87* (2023.01)

(58) Field of Classification Search
USPC .......................................... 310/322, 334, 335
See application file for complete search history.

(56) References Cited

U.S. PATENT DOCUMENTS

| | | | |
|---|---|---|---|
| 6,396,196 | B1 | 5/2002 | Takeuchi et al. |
| 10,178,472 | B1 * | 1/2019 | Rhee ........................ H04R 7/06 |
| 10,999,684 | B1 | 5/2021 | Wan et al. |
| 2002/0130593 | A1 | 9/2002 | Lee et al. |
| 2005/0140465 | A1 | 6/2005 | Hwu |
| 2005/0225213 | A1 | 10/2005 | Richards et al. |
| 2008/0152399 | A1 | 6/2008 | Umeda et al. |
| 2010/0061573 | A1 | 3/2010 | Fujise et al. |
| 2010/0086151 | A1 | 4/2010 | Ruiter |
| 2010/0194243 | A1 * | 8/2010 | Yoneyama ............ B06B 1/0696 310/338 |
| 2012/0169185 | A1 | 7/2012 | Harris |
| 2013/0322663 | A1 | 12/2013 | Melcher et al. |
| 2014/0098978 | A1 | 4/2014 | Fukuoka et al. |
| 2014/0119576 | A1 | 5/2014 | Ando et al. |
| 2014/0333179 | A1 | 11/2014 | Oh et al. |
| 2015/0155470 | A1 | 6/2015 | Mori |
| 2015/0188455 | A1 | 7/2015 | Oh et al. |
| 2015/0256656 | A1 | 9/2015 | Horii |
| 2015/0350792 | A1 | 12/2015 | Grosh et al. |
| 2016/0074906 | A1 | 3/2016 | Jeong et al. |
| 2017/0163176 | A1 | 6/2017 | Tsuchiya et al. |
| 2018/0002161 | A1 | 1/2018 | Jenkins et al. |
| 2018/0198054 | A1 | 7/2018 | Clingman et al. |
| 2019/0273992 | A1 | 9/2019 | Harris |
| 2020/0154185 | A1 | 5/2020 | Kim et al. |
| 2020/0225082 | A1 | 7/2020 | Akkaraju et al. |
| 2020/0314553 | A1 | 10/2020 | Kim et al. |
| 2020/0314555 | A1 | 10/2020 | Pfaffinger |
| 2020/0411750 | A1 | 12/2020 | Hughes et al. |
| 2021/0304722 | A1 | 9/2021 | Kho et al. |
| 2022/0286772 | A1 | 9/2022 | Zhou et al. |

FOREIGN PATENT DOCUMENTS

| | | | |
|---|---|---|---|
| CN | 102143425 | A | 8/2011 |
| CN | 202551341 | U | 11/2012 |
| CN | 111050256 | A | 4/2020 |
| CN | 111063790 | A | 4/2020 |
| CN | 113746374 | A | 12/2021 |
| CN | 215773557 | U | 2/2022 |
| JP | S63110900 | A | 5/1988 |
| JP | H06237143 | A | 8/1994 |
| JP | H1094093 | A | 4/1998 |
| JP | 2000167486 | A | 6/2000 |
| JP | 2000307164 | A | 11/2000 |
| JP | 2006238072 | A | 9/2006 |
| JP | 2010212968 | A | 9/2010 |
| JP | 2018157347 | A | 10/2018 |
| KR | 20170091374 | A | 8/2017 |
| TW | M506432 | U | 8/2015 |
| TW | I589162 | B | 6/2017 |
| WO | 8902658 | A1 | 3/1989 |
| WO | 0193628 | A2 | 12/2001 |
| WO | 02078099 | A2 | 10/2002 |
| WO | 2020232259 | A1 | 11/2020 |

OTHER PUBLICATIONS

The Office Action in Russian Application No. 2022125014 mailed on May 2, 2023, 22 pages.
Preumont A et al., Spatial Filters in Structural Control, Journal of Sound and Vibration, 265: 61-79, 2003.
The Extended European Search Report in European Application No. 22769068.2 mailed on May 17, 2023, 8 pages.
Decision of Refusal in Japanese Application No. mailed on Dec. 2, 2024, 6 pages.
Notice of Reasons for Rejection in Japanese Application No. 2022565896 mailed on May 7, 2024, 8 pages.
C. Volkan Karadag et al., Optimization of Beam Profiles for Improved Piezoelectric Energy Harvesting Efficiency, Structural and Multidisciplinary Optimization, 2020, 13 pages.
Office Action Report in Brazilian Application No. 112022020317-9 mailed on Feb. 3, 2026, 7 pages.
Yu-Chen Chen et al., On the PZT/Si Unimorph Cantilever Design for the Signal-to-Noise Ratio Enhancement of Piezoelectric MEMS Microphone, Journal of Micromechanics and Microengineering, 31(105003): 1-16, 2021.

* cited by examiner

ACOUSTIC DEVICES

CROSS-REFERENCE TO RELATED APPLICATIONS

This application is a continuation of International Patent Application No. PCT/CN2022/084935, filed on Apr. 1, 2022, the contents of which are hereby incorporated by reference in its entirety.

TECHNICAL FIELD

The present disclosure relates to a field of acoustic technology, and in particular, to acoustic devices.

BACKGROUND

An acoustic device may transmit sound by deforming a piezoelectric component according to applying electrical energy to the piezoelectric component. For example, the acoustic device may generate vibrations by applying a driving voltage in a polarization direction of the piezoelectric component, using an inverse piezoelectric effect of the piezoelectric component, and outputting vibrations through a vibration output point of the piezoelectric component. Sound waves are transmitted from the acoustic device.

However, the piezoelectric component in the acoustic device has many vibration modes in an audible frequency range, and cannot form a relatively flat frequency response curve.

Therefore, it is necessary to propose acoustic devices capable of controlling vibration modes of a piezoelectric component.

SUMMARY

One of the embodiments of the present disclosure may provide an acoustic device. The acoustic device comprises a piezoelectric component, an electrode, and a vibration component. The piezoelectric component may generate vibration under an action of a driving voltage, the electrode may provide the driving voltage for the piezoelectric component, and the vibration component may be physically connected to the piezoelectric component to receive the vibration and generate sound. The piezoelectric component may include a substrate and a piezoelectric layer, wherein the piezoelectric layer may be covered on a surface of the substrate, the electrode may be covered on a surface of the piezoelectric layer, and a coverage area of the electrode on the surface of the piezoelectric layer may be less than an area of the surface of the substrate covered with the piezoelectric layer.

In some embodiments, the piezoelectric component may include a vibration output region.

In some embodiments, the piezoelectric component may further include a fixed region.

In some embodiments, the piezoelectric component may further include a vibration control component.

In some embodiments, a width of the electrode may gradually decrease from the fixed region to the vibration output region.

In some embodiments, the electrode may include two electrode envelope regions, and the two electrode envelope regions have opposite potentials.

In some embodiments, a transition point may exist between the two electrode envelope regions, and a width of the electrode in a first electrode envelope region of the two electrode envelope regions may gradually decrease from the fixed region to the transition point.

In some embodiments, the width of the electrode in a second electrode envelope region of the two electrode envelope regions may increase firstly and then decreases from the transition point to the vibration output region.

In some embodiments, the width of the electrode in the fixed region may be equal to a width of the fixed region.

In some embodiments, the width of the electrode in the vibration output region may be 0.

In some embodiments, the piezoelectric layer and the substrate may coincide.

In some embodiments, the piezoelectric layer may include a piezoelectric region and a non-piezoelectric region.

In some embodiments, the piezoelectric region and the electrode may coincide.

In some embodiments, the piezoelectric layer and the electrode may coincide.

In some embodiments, the piezoelectric layer may include a piezoelectric plate or a piezoelectric film.

In some embodiments, the electrodes may include a plurality of discrete electrode units distributed in two dimensions.

In some embodiments, among the plurality of discrete electrode units, a gap between two adjacent discrete electrode units at a center of the piezoelectric layer may be less than a gap between two adjacent discrete electrode units at a boundary of the piezoelectric layer.

In some embodiments, an area of a first discrete electrode unit at the center of the piezoelectric layer may be greater than an area of a second discrete electrode unit at the boundary of the piezoelectric layer.

In some embodiments, the electrode may include a continuous electrode distributed in two dimensions, and the continuous electrodes may include a plurality of hollow regions.

In some embodiments, an area of a first hollow region at the center of the piezoelectric layer may be less than an area of a second hollow region at the boundary of the piezoelectric layer.

In some embodiments, the electrode may be also covered on a second surface opposite to the surface of the piezoelectric layer, and a coverage area of the electrode on the second surface may be less than or equal to an area of the surface.

In some embodiments, the vibration control component may include a mass physically connected to the vibration output region.

In some embodiments, the acoustic device may further include a connector, and the connector may connect the vibration component and the piezoelectric component.

In some embodiments, the acoustic device may be a bone conduction audio device.

One of the embodiments of the present disclosure may provide an acoustic device. The acoustic device may comprise a piezoelectric component, an electrode, and a vibration component. The piezoelectric component may generate vibration under an action of a driving voltage, the electrode may provide the driving voltage for the piezoelectric component, and the vibration component may be physically connected to the piezoelectric component to receive the vibration and generate sound. The piezoelectric component may comprise a substrate and a piezoelectric layer, wherein the piezoelectric layer may be covered on a surface of the substrate, the piezoelectric layer may include a piezoelectric region and a non-piezoelectric region, wherein the electrode may be covered on a surface of the piezoelectric layer, and the substrate, the piezoelectric layer and the electrode coincide respectively. A coverage area of the piezoelectric region on the substrate may be less than a coverage area of the piezoelectric layer on the substrate.

In some embodiments, the piezoelectric component may include a vibration output region.

In some embodiments, the piezoelectric component may further include a fixed region.

In some embodiments, a width of the piezoelectric region may gradually decrease from the fixed region to the vibration output region.

In some embodiments, the piezoelectric region may include two piezoelectric envelope regions, and potentials of two electrode regions corresponding to the two piezoelectric envelope regions are opposite.

In some embodiments, the width of the piezoelectric region in the fixed region may be equal to a width of the fixed region.

In some embodiments, the width of the piezoelectric region in the vibration output region may be 0.

In the embodiments of the present disclosure, a modal actuator of the piezoelectric component may be formed by an electrode design, so that the piezoelectric component can only generate an excitation force of a specific mode to output a specific vibration mode, thereby improving the sound characteristics of the acoustic device.

Moreover, compared with adding a modal control system consisting of different mechanical structures such as a spring, a mass, and a damping in a specific region, the embodiment of this present disclosure can realize the modal control of the piezoelectric component based on the electrode design, simplifying the structure of the acoustic device.

BRIEF DESCRIPTION OF THE DRAWINGS

The present disclosure is further illustrated in terms of exemplary embodiments. These exemplary embodiments are described in detail with reference to the drawings. These embodiments are non-limiting exemplary embodiments, in which the same reference numerals represent the same structures, and wherein.

Figure 1:
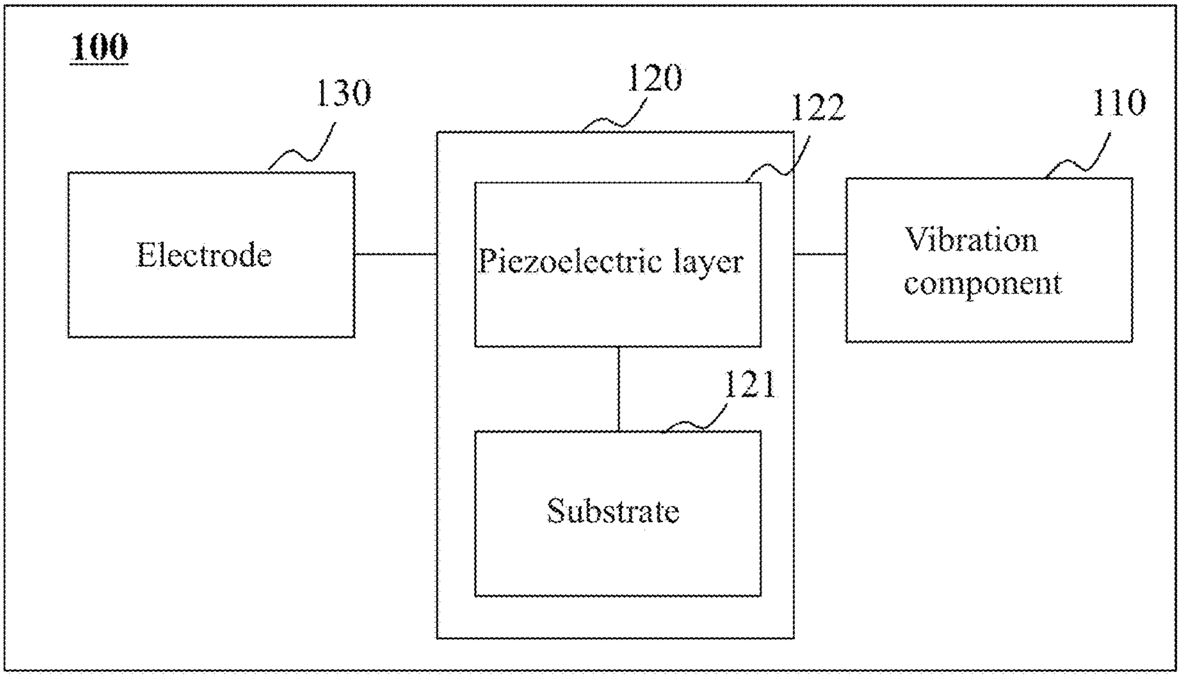
FIG. 1 is a block diagram illustrating an exemplary acoustic device according to some embodiments of the present disclosure.

100. acoustic device; 110. vibration component; 120. piezoelectric component; 130. electrode; 130-1. first-order electrode; 130-2. second-order electrode; 123. vibration output region; 121. substrate; 122. piezoelectric layer; 124. fixed region; 131. first electrode envelope region; 132. second electrode envelope region; 133. point; 1221. piezoelectric region; 1222. non-piezoelectric region; 140. mass block; 141. second vibration output region; 134. discrete electrode unit; 1341. first discrete electrode unit; 1342. second discrete electrode unit; 1343. third discrete electrode unit; 1344. fourth discrete electrode unit; 171. connector; 172. second shape; 135. continuous electrode; 136. hollow region; 1361. first hollow region; 1362. second hollow region; 170. mass.

DETAILED DESCRIPTION

The technical solutions of the present disclosure embodiments will be more clearly described below, and the accompanying drawings need to be configured in the description of the embodiments will be briefly described below. Obviously, the drawings in the following description are only some examples or embodiments of the disclosure. For those skilled in the art, the resent disclosure can also be applied to other similar situations according to these drawings without paying creative labor. Unless obviously obtained from the context or the context illustrates otherwise, the same numeral in the drawings refers to the same structure or operation.

It should be understood that the “system”, “device”, “unit” and/or “module” used herein is a method for distinguishing different components, elements, components, parts, or assemblies at different levels. However, if other words may achieve the same purpose, the words may be replaced by other expressions.

As shown in the description and the claims, unless the context expressly indicates exceptions, the words “a”, “an”, “one” and/or “the” do not specifically refer to the singular, but may also include the plural. Generally speaking, the terms "include" and "comprise" only indicate that the steps and elements that have been clearly identified are included, and these steps and elements do not constitute an exclusive list. The method or equipment may also include other steps or elements.

The flowcharts are used in the present disclosure to illustrate the operations performed by the system according to the embodiment of the present disclosure. It should be understood that the previous or subsequent operations are not necessarily performed accurately in order. Instead, the steps may be performed in reverse order or simultaneously. Moreover, one or more other operations may be added to the flowcharts or one or more operations may be removed from the flowcharts.

An acoustic device according to some embodiments of the present disclosure may output sound through vibrations generated by a piezoelectric component, so as to be applied to various scenes where audio needs to be played. For example, the acoustic device may be an independent audio output device (e.g., a stereo, a headphone, etc.) and may play audio according to user instructions. As another example, the acoustic device may be a module or a component in a terminal device (e.g., a mobile phone, a computer, etc.) and may play audio according to instructions of the terminal device. In some embodiments, the acoustic device may also adjust the deformation of the piezoelectric component to generate different vibrations according to a required frequency, a required volume, and other parameters of the sound to be output, so that the vibration component outputs different sounds according to different vibrations.

In some embodiments, the acoustic device may be a bone conduction acoustic device, and the vibration component in the bone conduction acoustic device may fit with the human body tissue of a user, and transmit the sound wave emitted by the vibration component to the inner ear of the user through the bone of the user. In some embodiments, the acoustic device may also be other types of acoustic devices, such as an air conduction acoustic device, a hearing aid, glasses, a helmet, an augmented reality (AR) device, a virtual reality (VR) device, etc., or alternatively, the acoustic device may be configured to output sound as part of an on-board audio system or an indoor audio system.

At present, the piezoelectric component in the acoustic device may have many vibration modes in the audible frequency range, so it is impossible to form a relatively flat frequency response curve. In addition, the vibration output region of the piezoelectric component may also form nodes at certain frequencies, affecting the output sound.

Some embodiments of the present disclosure provides an acoustic device. The acoustic device may include a piezoelectric component, an electrode, and a vibration component. The piezoelectric component may generate vibration under an action of a driving voltage. The electrode may provide the driving voltage for the piezoelectric component, and the vibration component may be physically connected to the piezoelectric component to receive the vibration and generate sound. The piezoelectric component may include a substrate and a piezoelectric layer. In some embodiments, the piezoelectric layer may cover a surface of the substrate, the electrode may cover a surface of the piezoelectric layer, and a coverage area of the electrode on the surface of the piezoelectric layer may be less than an area of the substrate covered with the piezoelectric layer. In some embodiments, the piezoelectric layer may cover the surface of the substrate, the electrode may cover the surface of the piezoelectric layer, and the substrate, the piezoelectric layer, and the electrode may coincide, respectively. The piezoelectric layer may include a piezoelectric region and a non-piezoelectric region, and a coverage area of the piezoelectric region on the substrate may be less than a coverage area of the piezoelectric layer on the substrate.

In some embodiments, a modal actuator of the piezoelectric component may be formed by an electrode design, so that the piezoelectric component may only generate an excitation force of a specific mode to output a specific vibration mode, thereby improving the sound characteristics of the acoustic device.

Moreover, compared with a modal control system composed of mechanical structures such as a spring, a mass, and a damping in a specific region, a modal control of the piezoelectric component based on the electrode design may be realized and the acoustic device may be simplified.

FIG. 1 is a block diagram illustrating an exemplary acoustic device 100 according to some embodiments of the present disclosure. In some embodiments, as shown in FIG. 1, the acoustic device 100 may include a vibration component 110, a piezoelectric component 120, and an electrode 130. The piezoelectric component 120 may generate vibration under an action of a driving voltage. The electrode 130 may provide the driving voltage for the piezoelectric component 120, and the vibration component 110 may be physically (e.g., mechanically or electromagnetically) connected to the piezoelectric component 120 to receive vibrations and generate sound.

The vibration component 110 may be configured as a component that transmits vibrations and generates sound. In some embodiments, the vibration component 110 may include an elastic element. The elastic element may respond to vibrations and deform to change sound pressures around, thereby generating sound waves and realizing sound output. In some embodiments, the elastic element may include a vibration-transmitting piece, a rubber piece, an elastic piece, or the like, or any combination thereof. In some embodiments, the material of the elastic element may be any material having the ability to transmit vibration. For example, the material of the elastic element may be silicone, plastic, rubber, metal, or the like, or any combination thereof. In some embodiments, the vibration component 110 may be a membrane structure (e.g., an air conducting vibration membrane, etc.), a plate structure (e.g., a bone conducting vibration panel, etc.), a mesh structure, or a layered structure, or the like.

An exemplary acoustic device 100 is provided below to describe an exemplary vibration component 110.

Figure 2:
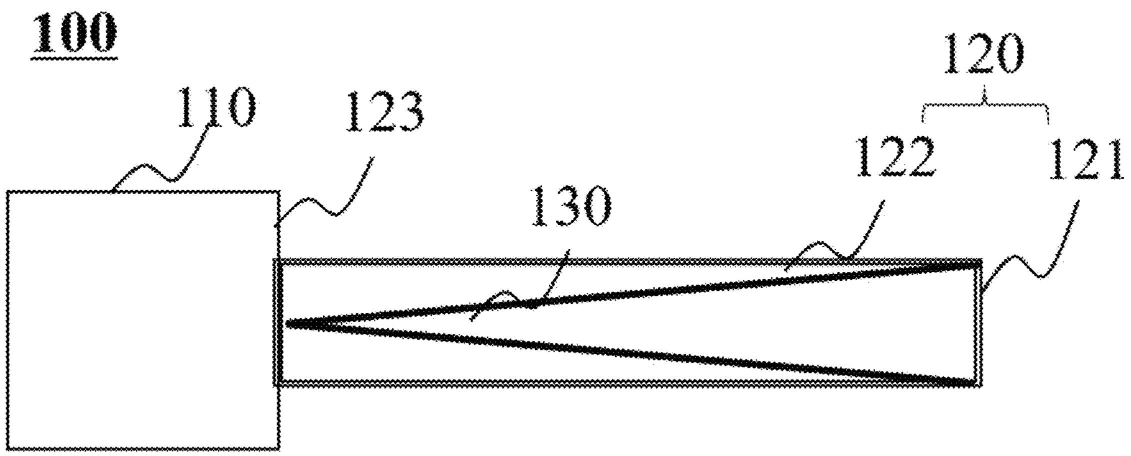
FIG. 2 is a schematic diagram illustrating an exemplary acoustic device according to some embodiments of the present disclosure.

FIG. 2 is a schematic diagram illustrating an exemplary acoustic device 100 according to some embodiments of the present disclosure. As shown in FIG. 2, one end of the vibration component 110 may be connected to a vibration output region 123 of the piezoelectric component 120 to receive vibrations. The other end of the vibration component 110 may output sound. For example, the vibration component 110 may transmit sound waves to a user through one or more media (e.g., air, the user's bone, etc.), so that the user can hear the sound output by the acoustic device 100.

The piezoelectric component 120 may be configured as an electrical energy conversion device that converts electrical energy into mechanical energy. In some embodiments, the piezoelectric component 120 may be deformed under the action of the driving voltage to generate vibration. In some embodiments, the piezoelectric component 120 may be in a shape of a sheet, an annular, a prism, a rectangular parallelepiped, a column, a sphere, or maybe other irregular shapes. In some embodiments, the piezoelectric component 120 may include a substrate 121 and a piezoelectric layer 122.

The substrate 121 may be configured as a carrier carrying components and an element that deforms in response to vibrations. In some embodiments, the material of the substrate 121 may include a combination of one or more of metals (e.g., copper clad foil, steel, etc.), phenolic resin, crosslinked polystyrene, or the like. In some embodiments, the shape of the substrate 121 may be determined according to the shape of the piezoelectric component 120. For example, if the piezoelectric component 120 is a piezoelectric beam, the substrate 121 may be correspondingly arranged in a strip shape. As another example, if the piezoelectric component 120 is a piezoelectric film, the substrate 121 may be correspondingly provided in a plate shape or a sheet shape.

The piezoelectric layer 122 may be a component configured with piezoelectric effect and/or an inverse piezoelectric effect. In some embodiments, the piezoelectric layer 122 may cover one or more surfaces of the substrate 121, and deform under the action of the driving voltage to drive the substrate 121 to deform, thereby realizing the output vibrations of the piezoelectric component 120. In some embodiments, whole of the piezoelectric layer 122 may be the piezoelectric region, that is, the piezoelectric layer 122 may be made of a piezoelectric material. In some embodiments, the piezoelectric layer 122 may include a piezoelectric region and a non-piezoelectric region. The piezoelectric region and the non-piezoelectric region may be connected to form the piezoelectric layer 122. In some embodiments, the piezoelectric region may be made of a piezoelectric material and the non-piezoelectric region may be made of a non-piezoelectric material. In some embodiments, the piezoelectric material may include a piezoelectric crystal, a piezoelectric ceramic, a piezoelectric polymer, or the like, or any combination thereof. In some embodiments, the piezoelectric crystal may include crystal, sphalerite, boracite, tourmaline, zincite, Gallium Arsenide (GaAs), barium titanate and its derived structure crystal, Potassium dihydrogen phosphate (KH2PO4), NaKC4H4O6·4H2O (seignette), or the like, or any combination thereof. In some embodiments, the piezoelectric ceramic may refer to a piezoelectric polycrystal formed by an irregular collection of fine grains obtained by solid-state reaction and sintering between different material powders. In some embodiments, the piezoelectric ceramic material may include barium titanate (BT), lead zirconate titanate (PZT), lead barium lithium niobate (PBLN), modified lead titanate (PT), aluminum nitride (AlN), and zinc oxide (ZnO), or the like, or any combination thereof. In some embodiments, the piezoelectric polymer material may include polyvinylidene fluoride (PVDF), etc. In some embodiments, the non-piezoelectric material may include ceramic and rubber. In some embodiments, the mechanical properties of the non-piezoelectric material may be similar to those of the piezoelectric material. In some embodiments, descriptions regarding the piezoelectric region and the non-piezoelectric region may be found elsewhere in the present disclosure (e.g., FIG. 8A or FIG. 8D).

The electrode 130 may be configured as an element that provides the driving voltage to the piezoelectric component 120. In some embodiments, the electrode 130 may be a combination of one or more electrode materials such as a metal electrode (e.g., a copper electrode, a silver electrode, etc.), a redox electrode (e.g., Pt|Fe and Fe electrode, Pt|Mn MnO electrode), an insoluble salt electrode (e.g., calomel electrode, mercury oxide electrode), or the like. In some embodiments, the electrode 130 may be disposed on at least one surface of the piezoelectric layer 122, for example, on two opposite surfaces of the piezoelectric layer 122. In some embodiments, the electrode 130 may be disposed on the surface of the piezoelectric layer 122 by one or more bonding methods such as coating, inlay, and bonding.

Figure 3:
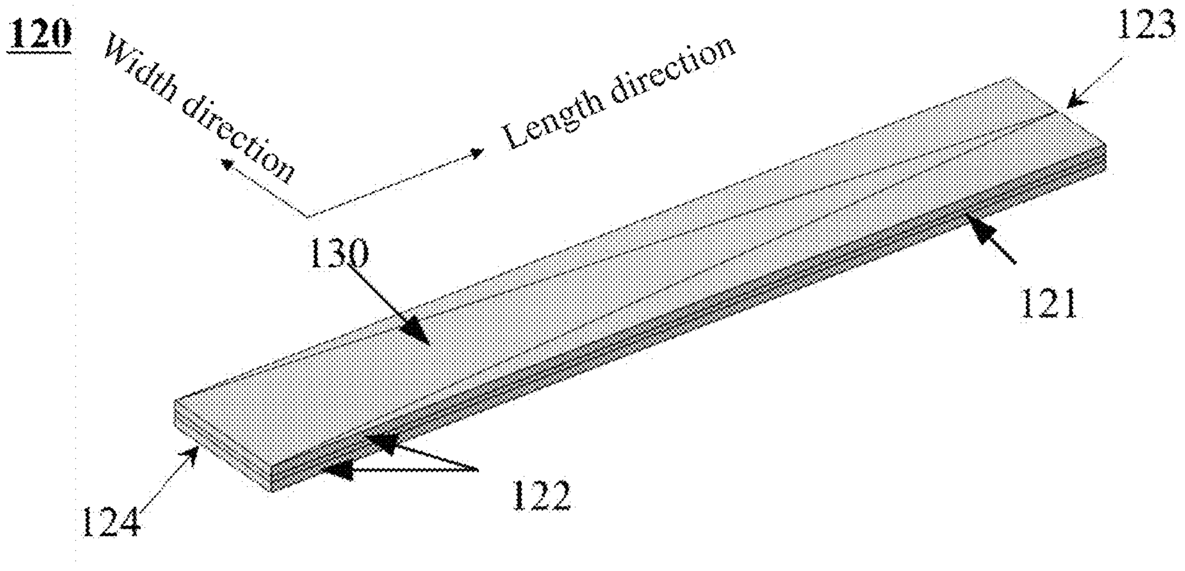
FIG. 3 is a schematic diagram illustrating an exemplary piezoelectric component according to some embodiments of the present disclosure.
Figure 4:
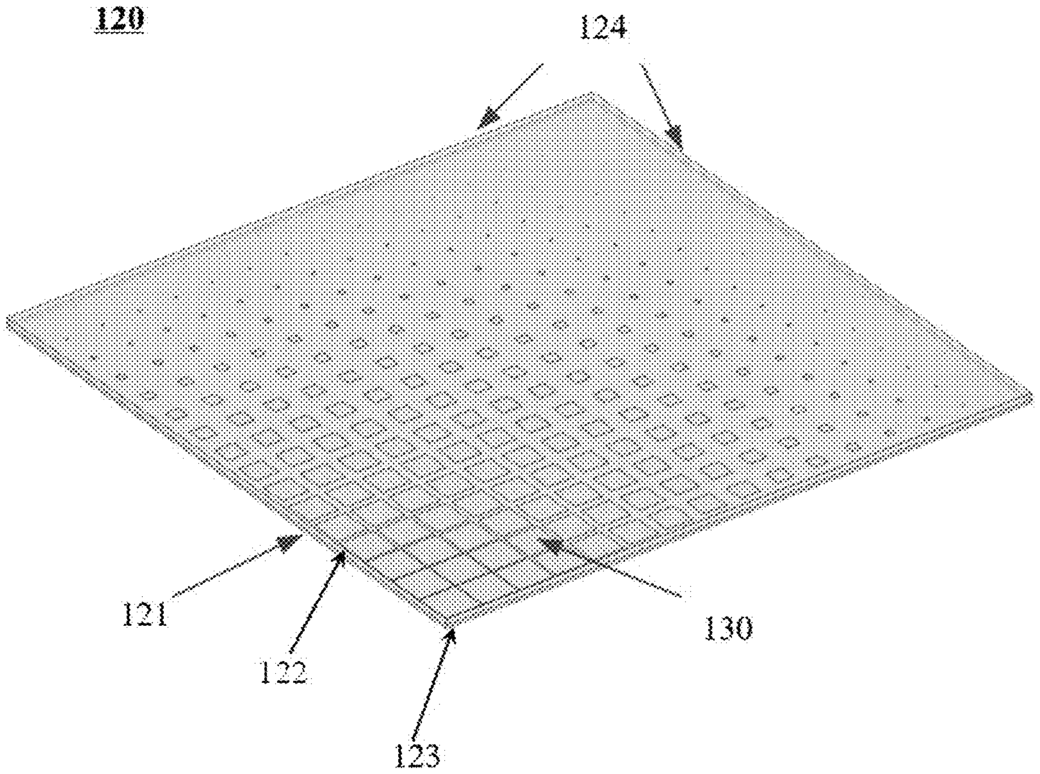
FIG. 4 is a schematic diagram illustrating part of an exemplary piezoelectric component according to some embodiments of the present disclosure.

In some embodiments, the piezoelectric layer 122 may cover at least one surface of the substrate 121. In some embodiments, the electrode 130 may cover at least one surface of the piezoelectric layer 122. FIGS. 3 and 4 provide two exemplary acoustic devices 100 to describe the arrangement between the substrate 121, the piezoelectric layer 122, and the electrode 130.

FIG. 3 is a schematic diagram illustrating an exemplary piezoelectric component 120 according to some embodiments of the present disclosure. As shown in FIG. 3, the piezoelectric component 120 may be a piezoelectric cantilever beam. The substrate 121 may carry the piezoelectric layer 122 and the electrode 130 (shown as a triangular-like region). In some embodiments, the electrodes 130 may be disposed on one or more surfaces of the piezoelectric layer 122 to provide the driving voltage for the piezoelectric layer 122. In some embodiments, the piezoelectric layer 122 may cover one or more surfaces of the substrate 121. When the piezoelectric layer 122 is deformed under the action of the driving voltage, the substrate 121 may also be deformed so that the vibration output region of the piezoelectric component 120 may output vibration. For example, the piezoelectric layer 122 may cover only one surface of the substrate 121. As another example, as shown in FIG. 3, two piezoelectric layers 122 may cover two opposite surfaces of the substrate 121, respectively.

FIG. 4 is a schematic diagram illustrating part of an exemplary piezoelectric component 120 according to some embodiments of the present disclosure. As shown in FIG. 4, the piezoelectric component 120 may be a piezoelectric plate (or piezoelectric film). The substrate 121 may carry the piezoelectric layer 122 and the electrode 130 (shown by a plurality of two-dimensional distributed squares). In some embodiments, an area of the piezoelectric layer 122 may be greater than or less than an area of the substrate 121. In some embodiments, the electrode 130 may be disposed on one or more surfaces of the piezoelectric plate to provide the driving voltage for the piezoelectric plate. In some embodiments, the piezoelectric layer 122 may cover one or more surfaces of the substrate 121. When the piezoelectric layer 122 is deformed under the action of the driving voltage, the substrate 121 may also be deformed so that the vibration output region of the piezoelectric plate may output vibrations. For example, as shown in FIG. 4, the piezoelectric layer 122 may cover only one surface of the substrate 121. As another example, the two piezoelectric layers 122 may cover two opposite surfaces of the substrate 121 respectively.

In some embodiments, the piezoelectric component 120 may include a vibration output region 123 for transmitting the vibrations generated by the piezoelectric component 120 to the vibration component 110. In some embodiments, the vibration output region 123 may be a surface, an edge, a point, or the like, or any combination thereof. As shown in FIG. 3, when the piezoelectric component 120 is the piezoelectric cantilever beam, an edge or a partial region of the surface of the piezoelectric component 120 may be the vibration output region 123. As shown in FIG. 4, when the piezoelectric component 120 is the piezoelectric plate or the piezoelectric film, an inner region of the piezoelectric component 120 (e.g., a central region of the vibration plane) may be the vibration output region 123.

In some embodiments, the piezoelectric component 120 may also include a fixed region 124. The fixed region 124 may be configured to fix a part of the piezoelectric component 120 and suppress the vibrations of the piezoelectric component 120 in the region so that most of the vibrations of the piezoelectric component 120 may be output from the vibration output region 123. In some embodiments, the fixed region 124 may correspond to the vibration output region 123. As shown in FIG. 3, when the piezoelectric component 120 is the piezoelectric cantilever beam, one end of the piezoelectric component 120 in a length direction may be the vibration output region 123, and the other end in the length direction corresponding to the vibration output region 123 may be the fixed region 124. For example, when the piezoelectric component 120 is the piezoelectric plate or the piezoelectric film, the vibration output region 123 may be an inner region of the piezoelectric component 120, and a boundary region of the piezoelectric component 120 may be the fixed region 124.

In some embodiments, the piezoelectric component 120 may not be provided with the fixed region 124, and the vibration may be transmitted through the vibration output region 123 to reduce the process flow and cost, and the piezoelectric component 120 may be easily moved.

In some embodiments, the vibrations of the piezoelectric component 120 may include one or more vibration modes. The vibration modes may be natural vibration characteristic of the piezoelectric component 120. When a shape of the electrode is not designed, there may be many vibration modes of the piezoelectric component 120, which makes the frequency response curve unstable and results in nodes in the vibration output region of the piezoelectric component 120 at certain frequencies, thereby affecting the output sound.

In some embodiments, the shape of the electrode 130 may be designed so that the electrode 130 forms a piezoelectric modal actuator to output an excitation force and the piezoelectric component 120 may generate only a specific modality. In some embodiments, a coverage area of the electrode 130 on the surface of the piezoelectric layer 122 may be less than an area of the surface of the substrate 121 covered with the piezoelectric layer 122, thereby realizing the electrode design. For example, as shown in FIG. 3, the area of the electrode 130 (shown as a triangle-like region) may be less than the area of the piezoelectric layer 122 and the area of the substrate 121. The piezoelectric layer 122 and the substrate 121 may coincide (i.e., the coverage area of the piezoelectric layer 122 on the substrate 121 is the entire surface area of one surface of the substrate 121). As another example, as shown in FIG. 4, the area of the electrode 130 (shown as a plurality of two-dimensional distribution squares) may be less than the area of the piezoelectric layer 122 and the area of the substrate 121. The piezoelectric layer 122 and the substrate 121 may coincide (i.e., the coverage area of the piezoelectric layer 122 on the substrate 121 is the entire surface area of one surface of the substrate 121).

In some embodiments, a profile curve of the electrode 130 may be determined according to a vibration mode function of the vibrations of the piezoelectric component 120, so as to perform modal control on the piezoelectric component 120. In some embodiments, the vibration mode function of the piezoelectric component 120 may include a first-order vibration mode, a second-order vibration mode, or the like. Correspondingly, the electrode 130 may include a first-order electrode 130-1 corresponding to the first-order vibration mode, and a second-order electrode 130-2 corresponding to the second-order vibration mode.

Taking the piezoelectric cantilever beam shown in FIG. 3 as an example below, two exemplary the first-order electrode 130-1 and the second-order electrodes 130-2 are provided respectively to describe the electrode design.

Figure 5A:
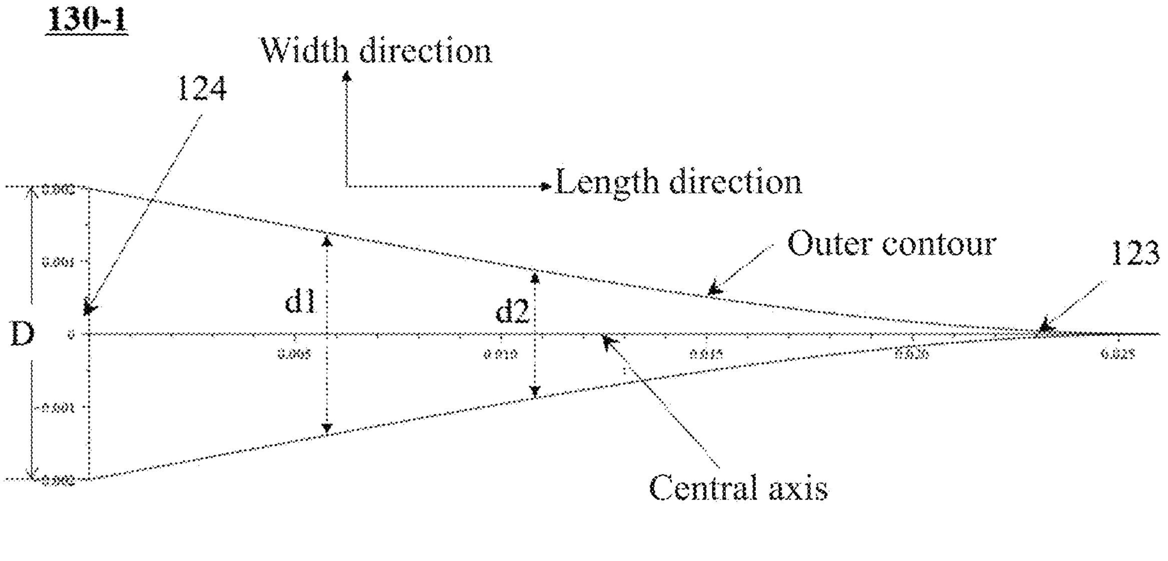
FIG. 5A is a schematic diagram illustrating an exemplary first-order electrode according to some embodiments of the present disclosure.
Figure 5B:
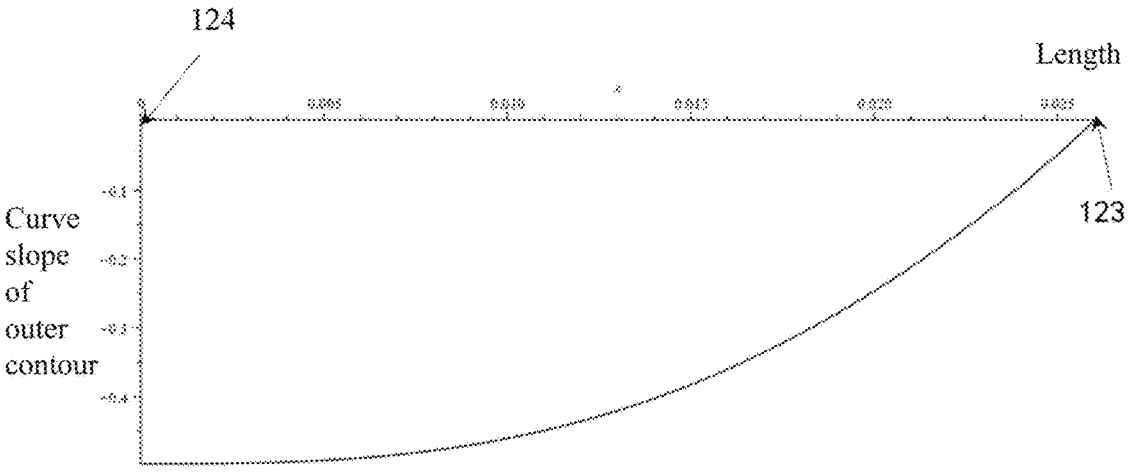
FIG. 5B is a schematic diagram illustrating a curve slope of an outer contour of part of an exemplary first-order electrode according to some embodiments of the present disclosure.

FIG. 5A is a schematic diagram illustrating an exemplary first-order electrode 130-1 according to some embodiments of the present disclosure. FIG. 5B is a schematic diagram illustrating a curve slope of an outer contour of part of an exemplary first-order electrode 130-1 according to some embodiments of the present disclosure.

In some embodiments, a width of the electrode 130 may gradually decrease from the fixed region 124 to the vibration output region 123. As used herein, "width of the electrode 130" may refer to a length of the electrode 130 on the width direction of the piezoelectric component 120 (e.g., the width direction of the piezoelectric cantilever beam). The width (e.g., d1, d2 as shown in FIG. 5A) of the electrode 130 at a certain position may be a distance between two intersections of a line perpendicular to a central axis of the piezoelectric component 120 along the length direction and the outer contour of the electrode 130 at the certain position. In some embodiments, the width of the electrode 130 may gradually decrease from the fixed region 124 to the vibration output region 123 and may include one or any combination of a gradient decrease, a linear decrease, or a curvilinear decrease in the width direction. As shown in FIG. 5A, the width of the first-order electrode 130-1 may decrease curvilinearly from a left side (e.g., the fixed region 124) to a right side (e.g., the vibration output region 123). As shown in FIG. 5B, an absolute value of the curve slope of the outer contour of the first-order electrode 130-1 along a portion above the central axis may gradually decrease with the increase of the length from the vibration fixed region 124 and decrease to 0 at the vibration output region 123. In some embodiments, the electrode 130 may be symmetrically arranged. For example, the electrode 130 may be symmetrical along the central axis of the piezoelectric component 120. In some embodiments, the electrode 130 may also be asymmetrically arranged. In some embodiments, a shape curve (i.e., the outer contour) of the electrode 130 may be a trigonometric function (e.g., sine function, cosine function, etc.), a hyperbolic function (e.g., hyperbolic sine function, hyperbolic cosine function, etc.), or the like, or any combination (e.g., a linear combination thereof).

Figure 5C:
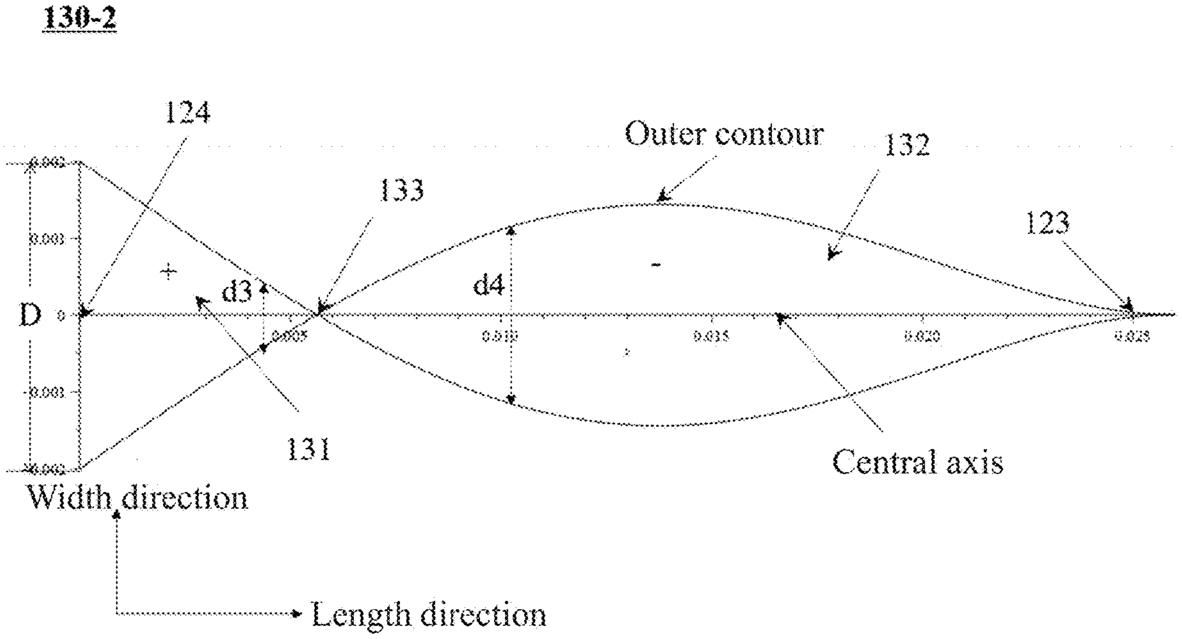
FIG. 5C is a schematic diagram illustrating an exemplary second-order electrode according to some embodiments of the present disclosure.

FIG. 5C is a schematic diagram illustrating an exemplary second-order electrode according to some embodiments of the present disclosure. FIG. 5 D is a schematic diagram illustrating a curve slope of an outer contour of part of an exemplary second-order electrode according to some embodiments of the present disclosure.

In some embodiments, the electrode 130 may include two electrode envelope regions, and the two electrode envelope regions have opposite potentials. An electrode envelope region may be a region where conductive medium of the electrode 130 is located, and the potential of the electrode envelope region may be a voltage across the electrode envelope region. For example, as shown in FIG. 5C, a voltage across the first electrode envelope region 131 of the second-order electrode 130-2 may be positive, and a voltage across the second electrode envelope region 132 may be negative. Alternatively, the voltage across the first electrode envelope region 131 may be negative, and the voltage across the second electrode envelope region 132 may be positive.

In some alternative embodiments, when polarization directions of the two electrode envelope regions are the same, the two electrode envelope regions can be controlled to externally connect potentials in the opposite direction so that the potentials of the two electrode envelope regions are opposite. In some alternative embodiments, when the polarization directions of the two electrode envelope regions are opposite, the two electrode envelope regions can be controlled to externally connect potentials in the same direction so that the potentials of the two electrode envelope regions are opposite.

In some embodiments, a transition point 133 may existed between the two electrode envelope regions, and the width of the electrode in the first electrode envelope region 131 of the two electrode envelope regions may gradually decrease from the fixed region 124 to the transition point 133.

In some embodiments, the transition point 133 may be a point where the potential between the electrode envelope regions is 0, and the potentials of the regions (e.g., the two electrode envelope regions) on both sides of the point are opposite. In some embodiments, the transition point 133 may be configured to distinguish the electrode envelope regions. For example, the electrode envelope region between the fixed region 124 and the transition point 133 may be the first electrode envelope region 131. The width (d3 as shown in FIG. 5C) of the electrode in the first electrode envelope region 131 at a certain position may be a distance between two intersections of a line perpendicular to the central axis of the piezoelectric component 120 in the length direction and the outer contour of the electrode 130 at the position. In some embodiments, the width of the electrode of the first electrode envelope region 131 decreases may include one or any combination of the gradient decrease, the linear decrease, or the curvilinear decrease.

Figure 5D:
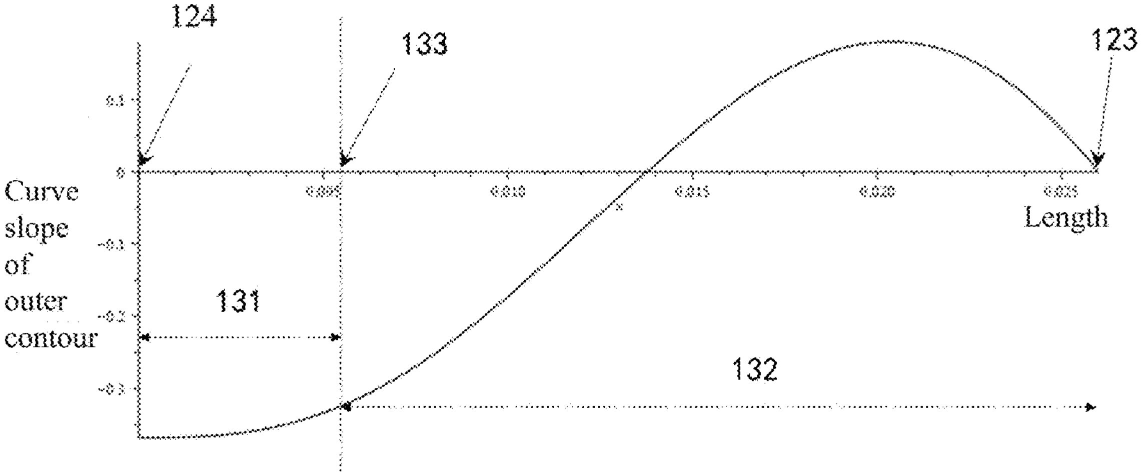
FIG. 5D is a schematic diagram illustrating a curve slope of an outer contour of part of an exemplary second-order electrode according to some embodiments of the present disclosure.

For example, as shown in FIG. 5C, when the electrode 130 is the second-order electrode 130-2, the potential of the transition point 131 may be 0, and the potentials of the first electrode envelope region 131 and the second electrode envelope region 132 are opposite. In addition, the width of the first electrode envelope region 131 may decrease curvilinearly from the left side (e.g., the fixed region 124) to the transition point 133. As shown in FIG. 5D, in the first electrode envelope region 131, the absolute value of the curve slope of the outer contour of the second-order electrode 130-2 along the portion above the central axis may gradually decrease with the increasing of the length from the vibration fixed region 124 to the transition point 133.

In some embodiments, the width of the electrode of the second electrode envelope region 132 of the two electrode envelope regions may increase firstly and then decrease from the transition point 133 to the vibration output region 123. The width of the electrode in the second electrode envelope region 132 at a certain position (e.g., d4 as shown in FIG. 5C) may be a distance between two intersections of a line perpendicular to the longitudinal central axis of the piezoelectric component 120 and the outer contour of the electrode 130 at the position. In some embodiments, the electrode envelope region between the transition point 133 and the vibration output region 123 may be the second electrode envelope region 132. In some embodiments, the width of the electrode in the second electrode envelope region 132 may increase firstly and then decrease. The decrease may include one or more decrease methods such as a gradient change, a linear change, or curvilinear change. For example, as shown in FIG. 5C, the width of the electrode in the second electrode envelope region 132 may increase curvilinearly from the left side (e.g., the transition point 133), and an increased amplitude becomes increasingly small until the width reaches the peak, then the width of the electrode begins to decrease curvilinearly until the vibration output region 123. The decreased amplitude increases firstly and then decreases. As shown in FIG. 5D, in the second electrode envelope region 132, the absolute value of the curve slope of the outer contour of the second-order electrode 130-2 along the portion above the central axis may decrease firstly from the transition point 133 as the length increases and then decreases to 0 at the widest point of the second electrode envelope region 132. Then, with the increase of the length, the absolute value of the curve slope increases firstly and then decreases, and decreases to 0 at the vibration output region 123.

In some embodiments, the electrode 130 may further include one or more envelope regions such as a third electrode envelope region and a fourth electrode envelope region. The shape and count of the electrode envelope regions may be determined according to the vibration mode function of the piezoelectric component 120 that needs to be controlled.

In some embodiments, the width of the electrode 130 in the fixed region 124 may be equal to the width of the fixed region 124. As shown in FIGS. 5A and 5C, the width of the fixed region 124 may be D, and correspondingly, the width of the electrode 130 in the fixed region 124 may also be D.

In some alternative embodiments, the width of the electrode 130 in the fixed region 124 may not be equal to the width of the fixed region 124. For example, the width of the electrode 130 may be less than the width of the fixed region 124 or greater than the width of the fixed region 124.

In some embodiments, the width of the electrode 130 in the vibration output region 123 may be 0. As shown in FIGS. 5A and 5C, the width of the electrode 130 in the vibration output region 123 may be 0.

In some alternative embodiments, the width of the electrode 130 in the vibration output region 123 may not be 0. For example, the width of the electrode 130 in the vibration output region 123 may be less than the width of the electrode 130 in the fixed region 124 and greater than 0.

Figure 6:
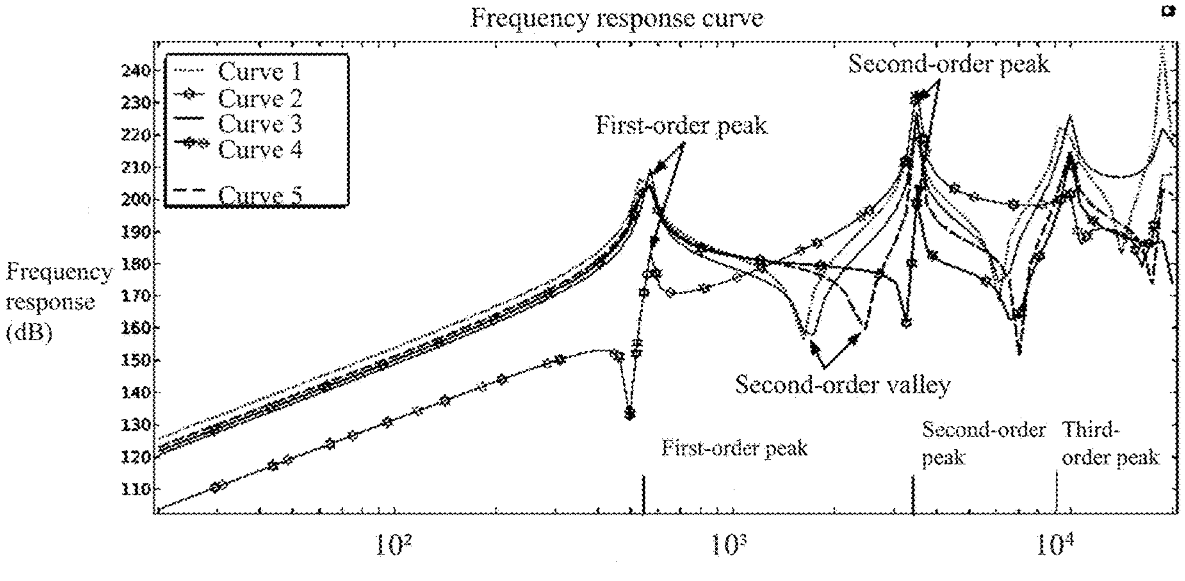
FIG. 6 is a schematic diagram illustrating a comparison of frequency response curves of exemplary piezoelectric components according to some embodiments of the present disclosure.

FIG. 6 is a schematic diagram illustrating a comparison of frequency response curves of exemplary piezoelectric components according to some embodiments of the present disclosure. As shown in FIG. 6, curve 1 is a frequency response curve at the vibration output region of the piezoelectric component 120 when the electrode 130 completely covers one surface of the piezoelectric component 120 (i.e., the electrode 130 and the piezoelectric component 120 coincide). Curve 2 is a frequency response curve of the piezoelectric component 120 including the first-order electrode as shown in FIG. 5A. Curve 3 is a frequency response curve of the piezoelectric component 120 including the second-order electrode as shown in FIG. 5C (and the potentials of the two envelope regions are opposite).

As shown in FIG. 6, curve 1 may have a first-order peak and a second-order valley, which may reflect that when the electrode 130 completely covers a surface of the piezoelectric component 120 (i.e., the electrode 130 and the piezoelectric component 120 coincide), the piezoelectric component 120 has a relatively complex vibration mode in the high frequency range, especially a significantly different vibration response in the range of 500 Hz to 3000 Hz. After covering the first-order electrode on the piezoelectric component 120, a first-order vibration mode frequency band of the piezoelectric component 120 shown in curve 2 may be extended, a second-order valley disappears, and a narrow-band jump of the curve may be generated at a second-order peak frequency (such as around 3000 Hz), and an amplitude of the second-order peak may be also reduced. In this way, the first-order electrode 130-1 may result in that the vibration response of the piezoelectric component 120 between the first-order peak and the second-order peak is flat. After covering the second-order electrode 130-2 (and the potentials of the two envelope regions are opposite) on the piezoelectric component 120, the frequency response curve of the piezoelectric component 120 shown in curve 3 may be in a second-order vibrationmode from the low-frequency stage (e.g., 0-100 Hz), and a narrow-band jump of the curve generated at the first-order peak frequency (e.g., between 500 Hz and 600 Hz). The first-order peak amplitude may be reduced. After the peak frequency, curve 3 is in the second-order vibration mode until the third-order peak frequency (such as 9000 Hz). In this way, the second-order electrode 130-2 may result in that the piezoelectric component 120 is in the second-order vibration mode from the low-frequency stage to the third-order peak. According to curves 2 and 3, the first-order electrode and the second-order electrode (and the potentials of the two envelope regions are opposite) have modal control effects. As used herein, "peak frequency" may refer to a frequency of a peak (e.g., a first-order peak, a second-order peak, a third-order peak, etc.) of the piezoelectric component 120 when the electrode 130 completely covers a surface of the piezoelectric component 120 (i.e., the electrode 130 and the piezoelectric component 120 coincide).

Moreover, as shown in FIG. 6, curve 4 is a frequency response curve of the piezoelectric component 120 covering the second-order electrode 130-1 (the potentials of the two envelope regions are the same) as shown in FIG. 5C; curve 5 is a frequency response curve of the piezoelectric component 120 covering a triangular electrode (i.e., an isosceles triangle formed by the fixed region 124 and the center points of the vibration output region 123 of the piezoelectric component 120 as the electrode). When covering a triangular electrode, although the frequency response curve of the piezoelectric component 120 shown by curve 5 still has a second-order valley, the second-order valley is significantly backward compared to curve 1 which the piezoelectric component 120 is completely covered by the electrode. Thus, the triangular electrode 130 may result in that the response of the piezoelectric component 120 between the first-order peak frequency and the second-order valley frequency is flat. After covering the second-order electrode 130-2 (the potentials of the two envelope regions are opposite), the frequency response curve of the piezoelectric component 120 shown by curve 4 may be similar to that of curve 1 (the electrode 130 completely covers a surface of the piezoelectric component 120).

Figure 7A:
FIG. 7A is a vibration mode of a piezoelectric component at a second-order valley frequency when an electrode is completely covered on a surface of the piezoelectric component (i.e., the electrode and the piezoelectric component coincide)
Figure 7B:
FIG. 7B is a vibration mode of a piezoelectric component using a first-order electrode at a second-order valley frequency according to some embodiments of the present disclosure.
Figure 7C:
FIG. 7C is a vibration mode of a piezoelectric component using a second-order electrode at a second-order valley frequency according to some embodiments of the present disclosure.

FIG. 7A is a vibration mode of a piezoelectric component 120 at a second-order valley frequency when an electrode is completely covered on a surface of the piezoelectric component (i.e., the electrode and the piezoelectric component coincide). FIG. 7B is vibration mode of a piezoelectric component using a first-order electrode at a second-order valley frequency according to some embodiments of the present disclosure; FIG. 7C is a vibration mode of a piezoelectric component using a second-order electrode at a second-order valley frequency according to some embodiments of the present disclosure.

Referring to FIG. 6 and FIGS. 7A-7C, when the electrode completely covers a surface of the piezoelectric component (i.e., the electrode and the piezoelectric component coincide), the vibration response of the piezoelectric component 120 fluctuates greatly at the second-order valley frequency (e.g., 1622 Hz), and the frequency response curve may be not flat. However, the vibration response of the piezoelectric component 120 covering the electrode (e.g., the first-order electrode 130-1 or the second-order electrode 130-2) has less fluctuation, the frequency response curve may be flat, and it is difficult to form a node.

In some embodiments, the modal actuator of the piezoelectric component 120 may be formed by covering the electrode 130 designed according to some embodiments of the present disclosure, so that the piezoelectric component 120 can only generate the excitation force of a specific mode to output a specific vibration mode, thereby improving the acoustic characteristics of the acoustic device. Moreover, the frequency response curve of the piezoelectric component 120 may be stable, thereby preventing the vibration output region 123 of the piezoelectric component 120 from forming nodes, and improving the operational reliability of the acoustic device 100.

In addition, compared with the modal control system composed of mechanical structures such as the spring, the mass, and the damping in a specific region, the embodiments of the present disclosure may realize the modal control of the piezoelectric component 120 based on the designing of the electrode 130, and simplify the structure of the acoustic device 100.

In some embodiments, the piezoelectric component 120 may also be designed according to the designing of the electrode 130. The specific embodiments of designing the piezoelectric component 120 may be described in detail below by taking several exemplary designs using the one-dimensional first-order electrode 130-1 as an example.

Figure 8A:
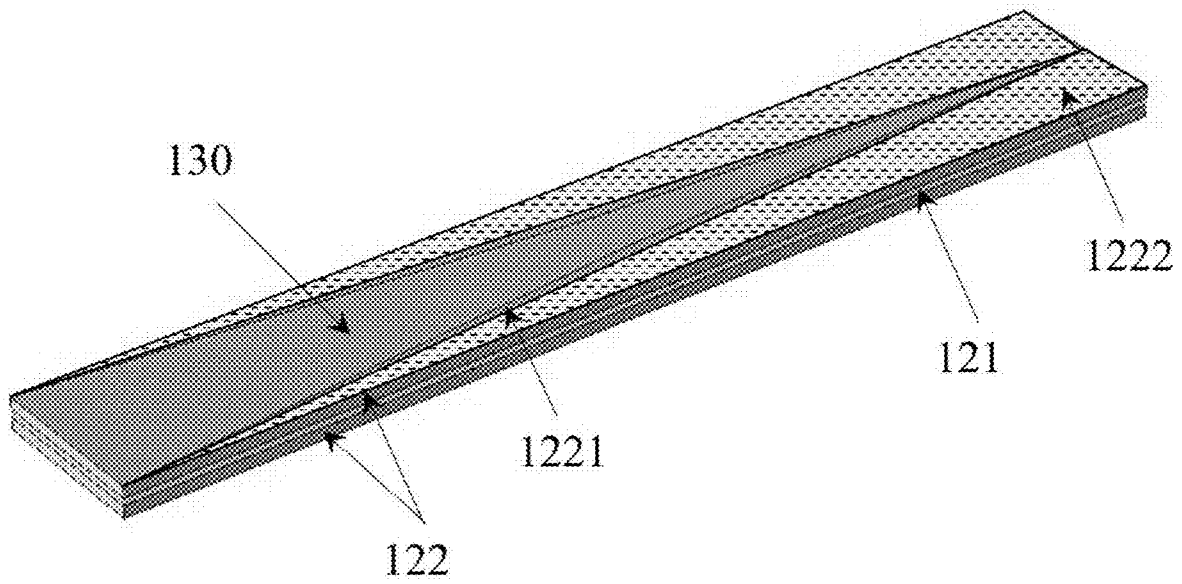
FIG. 8A is a schematic diagram illustrating an electrode and a piezoelectric component according to some embodiments of the present disclosure.
Figure 8B:
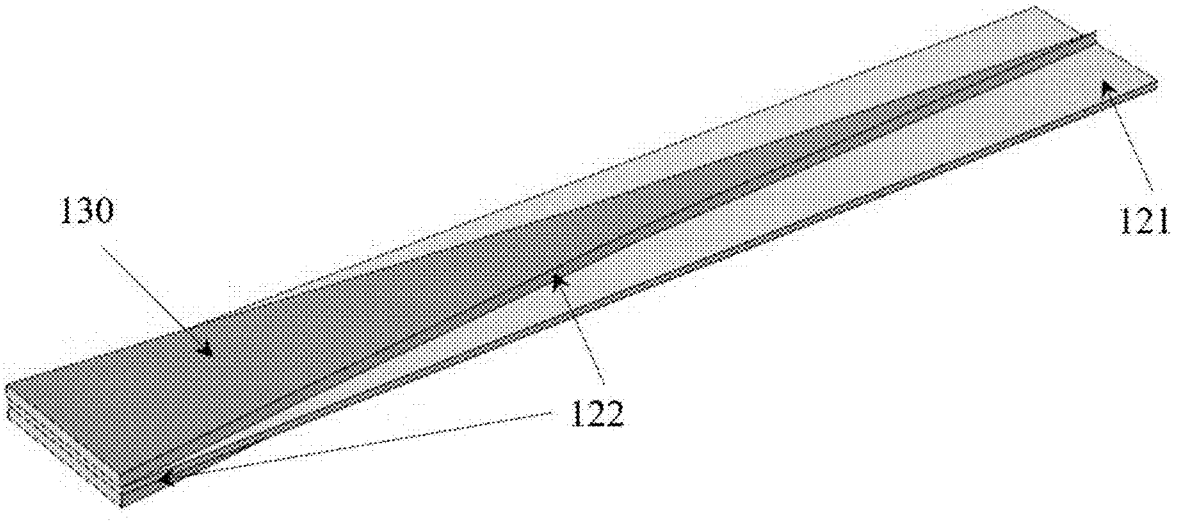
FIG. 8B is a schematic diagram illustrating an electrode and a piezoelectric component according to some embodiments of the present disclosure.
Figure 8C:
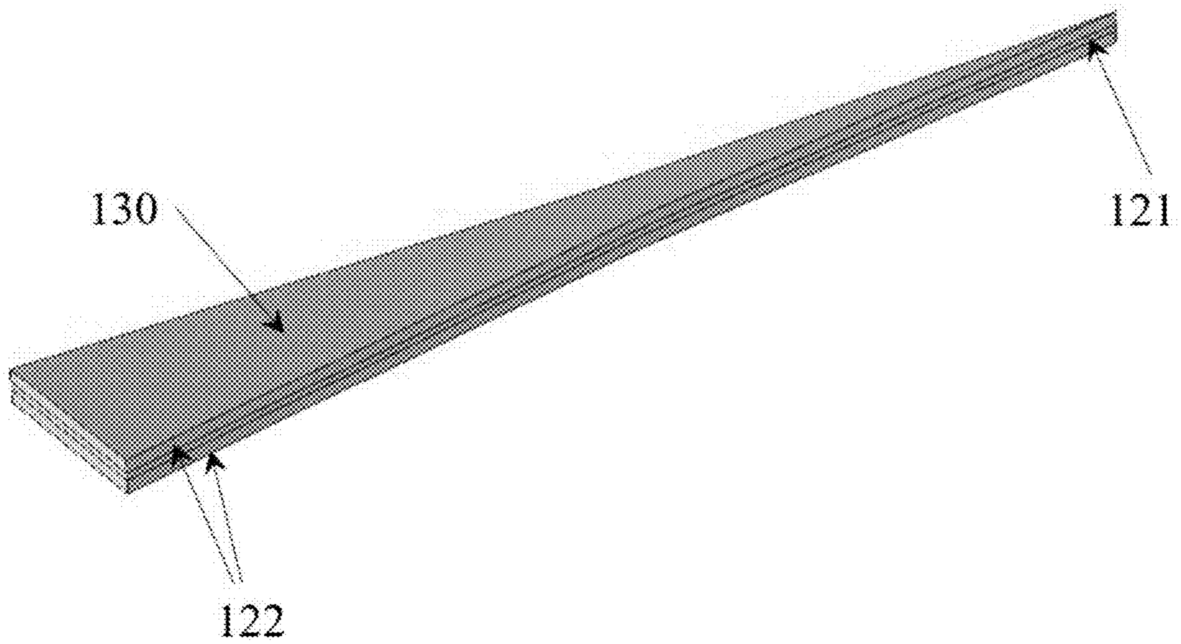
FIG. 8C is a schematic diagram illustrating an electrode and a piezoelectric component according to some embodiments of the present disclosure.
Figure 8D:
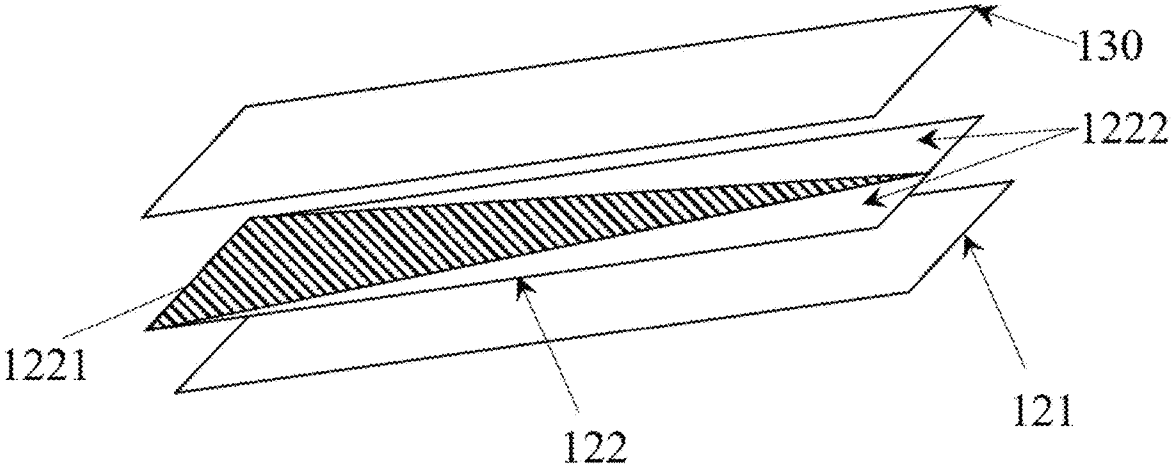
FIG. 8D is an exploded view of an electrode and a piezoelectric component according to some embodiments of the present disclosure.

FIG. 8A is a schematic diagram illustrating an electrode 130 and a piezoelectric component 120 according to some embodiments of the present disclosure; FIG. 8B is a schematic diagram illustrating an electrode 130 and a piezoelectric component 120 according to some embodiments of the present disclosure; FIG. 8C is a schematic diagram illustrating an electrode 130 and a piezoelectric component 120 according to some embodiments of the present disclosure; FIG. 8D is an exploded view of an electrode 130 and a piezoelectric component 120 according to some embodiments of the present disclosure. It should be understood that triangular regions (or triangular-like regions) shown in FIGS. 8A-8D are only for illustration and are not used to define the shape of the electrodes.

In some embodiments, as shown in FIG. 3, the substrate 121 may be rectangular, and the piezoelectric layer 122 may be a rectangular piezoelectric beam (e.g., whole of the piezoelectric layer 122 is the piezoelectric region) that coincide with the substrate 121, and the electrode 130 may be a first-order electrode 130-1. A coverage area of the electrode 130 (shown in a triangular-like region)<a coverage area of the piezoelectric layer 122=a surface area of the substrate 121 covering the piezoelectric layer 122.

In some embodiments, as shown in FIG. 8A, the substrate 121 may be rectangular, the piezoelectric layer 122 may be a rectangular piezoelectric beam coinciding with the substrate 121, and the electrode 130 may be the first-order electrode 130-1. The piezoelectric layer 122 may include a piezoelectric region 1221 (made of a piezoelectric material) and a non-piezoelectric region 1222 (made of a non-piezoelectric material). The piezoelectric region 1221 may coincide with the first-order electrode 130-1 (the dotted line inside the piezoelectric region 1221 is only used to distinguish the piezoelectric region 1221 and the electrode 130, and is not used to define the size of the piezoelectric region 1221 and the electrode 130). That is, the coverage area of the electrode 130 (shown as a triangle-like region)=the coverage area of the piezoelectric region 1221<the coverage area of the piezoelectric layer 122=the surface area of the substrate 121 that covers the piezoelectric layer 122.

In some embodiments, as shown in FIG. 8B, the substrate 121 may be rectangular, the electrode 130 may be the first-order electrode 130-1. The piezoelectric layer 122 may coincide with the electrode 130, and the coverage areas of the piezoelectric layer 122 and the electrode 130 may be less than the surface area of the substrate 121 that covers the piezoelectric layer 122. The coverage area of the electrode 130 (shown in the triangular-like region)=the coverage area of the piezoelectric layer 122<the surface area of the substrate 121 that covers the piezoelectric layer 122. That is, the piezoelectric material in a region where the electrode does not cover in the piezoelectric layer 122 may be removed, and the substrate may be still a rectangular beam.

In some embodiments, as shown in FIG. 8C, the electrode 130 may be a first-order electrode 130-1, and the substrate 121 and the piezoelectric layer 122 may both coincide with the electrode 130. That is, the coverage area of the electrode 130 (shown in the triangle-like region)=the coverage area of the piezoelectric layer 122=the surface area of the substrate 121 that covers the piezoelectric layer 122.

In some embodiments, the piezoelectric layer 122 may coincide with the substrate 121. For example, as shown in FIG. 3 or FIG. 8C, the coverage area of the piezoelectric layer 122=the surface area of the substrate 121 that covers the piezoelectric layer 122. In some alternative embodiments, the piezoelectric layer 122 may not coincide with the substrate 121. For example, as shown in FIG. 8B, the area of the piezoelectric layer 122 may be less than the area of the substrate 121.

In some embodiments, whole of the piezoelectric layer 122 may be the piezoelectric region. For example, as shown in FIG. 3, FIG. 8B, or FIG. 8C, the piezoelectric layer 122 may be entirely supported by the piezoelectric material. In some embodiments, the piezoelectric layer 122 may include the piezoelectric region 1221 and the non-piezoelectric region 1222. For example, as shown in FIG. 8A, the piezoelectric layer 122 may include the piezoelectric region 1221 made of the piezoelectric material and the non-piezoelectric region 1222 made of the non-piezoelectric material. The area of the piezoelectric layer 122 may be equal to a sum of an area of the piezoelectric region 1221 and an area of the non-piezoelectric region 1222.

In some embodiments, the piezoelectric region 1221 may coincide with the electrode 130. For example, as shown in FIG. 8A, the piezoelectric region 1221 in the piezoelectric layer 122 may be equal to the coverage area of the electrode 130, and spatial positions of the piezoelectric layer 122 and the electrode 130 may coincide with each other.

In some embodiments, the piezoelectric layer 122 may coincide with the electrode 130. For example, as shown in FIG. 8B or FIG. 8C, the coverage area of the piezoelectric layer 122 may be equal to the coverage area of the electrode 130, and the spatial positions of the piezoelectric layer 122 and the electrode 130 may coincide with each other.

In some embodiments, an effective electrode portion of the electrode 130 may generate a specific mode for the piezoelectric component 120 by designing the covering shape of the electrode 130 and the piezoelectric region. For example, the piezoelectric layer 122 may include the piezoelectric region made of the piezoelectric material and the non-piezoelectric region made of the non-piezoelectric material. The sum of the areas of the piezoelectric region and the non-piezoelectric region may be equal to the coverage area of the piezoelectric layer 122 on the substrate 121, and the substrate 121 and the piezoelectric layer 122 may coincide. The sum of the areas of the piezoelectric region and the non-piezoelectric region may be equal to the coverage area of the electrode 130 on the piezoelectric layer 122, that is, the electrode 130 and the piezoelectric layer 122 may coincide. In some embodiments, the coverage area of the piezoelectric region on the substrate 121 may be less than the coverage area of the piezoelectric layer 122 on the substrate 121. For example, as shown in FIG. 8D, the substrate 121 may be rectangular, the piezoelectric layer 122 may be a rectangular piezoelectric beam coinciding with the substrate 121, and the electrode 130 may be a rectangular electrode. The piezoelectric layer 122 may include the piezoelectric region 1221 and the non-piezoelectric region 1222. The shape and the area of the piezoelectric region 1221 (shown as the twill-filled region) are used to define the effective region of the rectangular electrode 130. That is, the area of the piezoelectric region 1221<the coverage area of the piezoelectric layer 122=the coverage area of the electrode 130=the surface area of the substrate 121 that covers the piezoelectric layer 122. Part of the electrode 130 that covers on the piezoelectric region 1221 may provide the driving voltage for the piezoelectric component 120, that is, the part of the electrode 130 may be an effective electrode part. The part of the electrode 130 that covers the non-piezoelectric region 1222 may only act as a conductive component to transmit electric energy for the effective electrode part. Therefore, the coverage area of the piezoelectric region 1221 on the substrate 121 may be regarded as the area of effective region of the electrode 130. Thus, the electrode 130 may be designed by designing the piezoelectric region 1221, so that the part of the electrode 130 that covers the piezoelectric region 122 may control the piezoelectric component 120 to output a specific mode.

Figure 9:
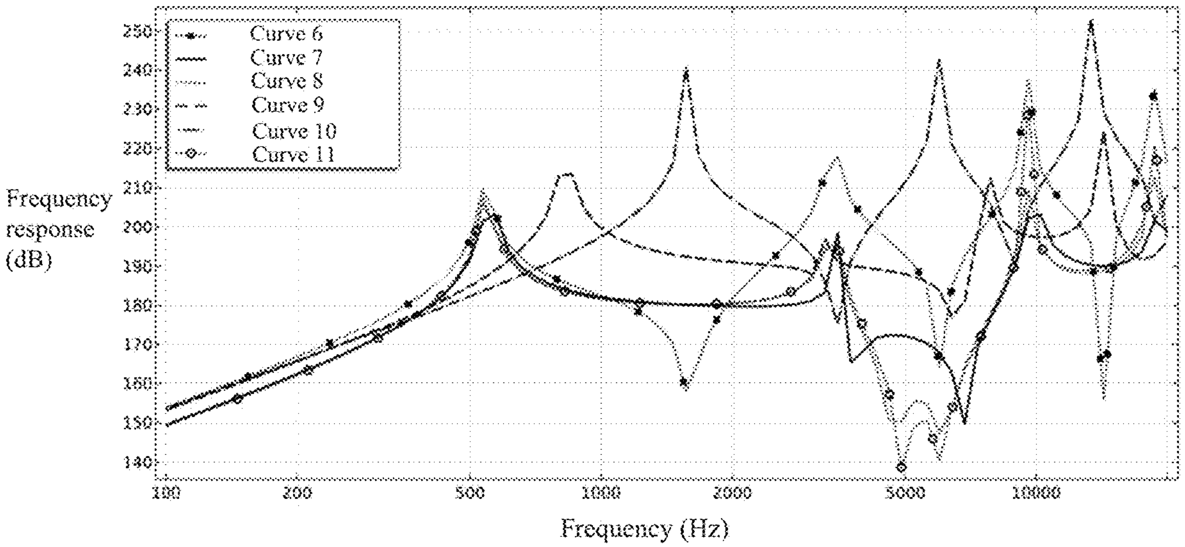
FIG. 9 is a schematic diagram illustrating a frequency response curve of a piezoelectric component according to some embodiments of the present disclosure.

FIG. 9 is a schematic diagram illustrating a frequency response curve of a piezoelectric component 120 according to some embodiments of the present disclosure. In some embodiments, curve 6 is a frequency response curve of the piezoelectric component 120 when the rectangular electrode completely covers a surface of the rectangular piezoelectric component (that is, the electrode, the piezoelectric component, and the substrate all coincide). Curve 7 is a frequency response curve of the piezoelectric component 120 shown in FIG. 3 (i.e., the coverage area of the electrode 130<the coverage area of the piezoelectric layer 122=the surface area of the substrate 121 that covers the piezoelectric layer 122). Curve 8 is a frequency response curve of the piezoelectric component 120 shown in FIG. 8A or FIG. 8D (i.e., the coverage area of the electrode 130=the coverage area of the piezoelectric region 1221<the coverage area of the piezoelectric layer 122=the surface area of the substrate 121 that covers the piezoelectric layer 122 or the coverage area of the piezoelectric region<the coverage area of the piezoelectric layer 122=the coverage area of the electrode 130=the surface area of the substrate 121 that covers the piezoelectric layer 122). Curve 9 is a frequency response curve of the piezoelectric component 120 shown in FIG. 8B (i.e., the coverage area of the electrode 130=the coverage area of the piezoelectric layer 122<the surface area of the substrate 121 that covers the piezoelectric layer 122), and curve 10 is a frequency response curve of the piezoelectric component 120 shown in FIG. 8C (i.e., the coverage area of the electrode 130=the coverage area of the piezoelectric layer 122=the surface area of the substrate 121 that covers the piezoelectric layer 122).

As shown in FIG. 9, when the electrode completely covers a surface of the piezoelectric component (i.e., the electrode and the piezoelectric component coincide), the frequency response curve of the piezoelectric component 120 shown in curve 6 has a first-order peak and a second-order valley, and the piezoelectric component 120 has multiple modes. The frequency response characteristics of curve 7 and curve 8 are similar, which may reflect that the characteristics of the frequency response curve are similar when the piezoelectric material in the region which is not covered by the electrode is replaced with a non-piezoelectric material (or the effective region of the electrode is defined by the shape of the piezoelectric region) compared with the whole region is made of the piezoelectric material. The frequency response amplitude of curve 9 may be significantly increased, while the low-frequency peak moves towards high-frequency, and the second-order vibration mode is significantly suppressed and smoothly transition to the third-order valley, which may reflect that the removal of the piezoelectric material in the region which is not covered by the electrode 130 so that the piezoelectric layer 122 coincide with the electrode 130, and when the coverage area of the piezoelectric layer 122 (or the electrode 130) is less than the surface area of the substrate 121 that covers the piezoelectric layer 122, the mode can be controlled. The frequency response curve shown by curve 10 still has a first-order peak and a second-order valley, and there are still many modes, which may reflect that when the substrate 121, the piezoelectric layer 122, and the electrode 130 are all in the shape of the first-order electrode 130-1, the frequency response characteristics are consistent with that when the electrode completely covers a surface of the piezoelectric component (that is, the electrode and the piezoelectric component coincide). Therefore, the shape of the first-order electrode 130-1 may affect the vibration mode of the rectangular piezoelectric cantilever beam. However, the shape of the first-order electrode 130-1 may not control the vibration mode of the piezoelectric cantilever beam that has a same shape with that of the first-order electrode 130-1.

In some embodiments, adopting the first-order electrode 130-1 to cover the piezoelectric layer 122 compared to adopting the first-order electrode 130-1 to cover the piezoelectric region 1221 and the other region of the piezoelectric layer 122 are replaced with the non-piezoelectric region 1222 made of the non-piezoelectric material, the potential distribution of the piezoelectric layer 122 are same. For example, when the vibration frequency of the piezoelectric component 120 is about 100 Hz, there is no potential difference in the region of the piezoelectric layer 122 that is not covered by the first-order electrode 130-1 in the piezoelectric component 120 as shown in FIG. 3. After the material of the uncovered region of the electrode 130 on the piezoelectric layer 122 as shown in FIG. 8A is replaced with a non-piezoelectric material, the non-piezoelectric region that is not covered by the electrode has no electrical performance.

In some embodiments, the piezoelectric component 120 may be designed according to the designing of the electrode 130, and the piezoelectric material of the region that is not covered by the electrode in the piezoelectric component 120 may be replaced with the non-piezoelectric material, so as to ensure that the piezoelectric component 120 may normally output vibrations while reducing the manufacturing cost of the piezoelectric component 120.

Figure 10:
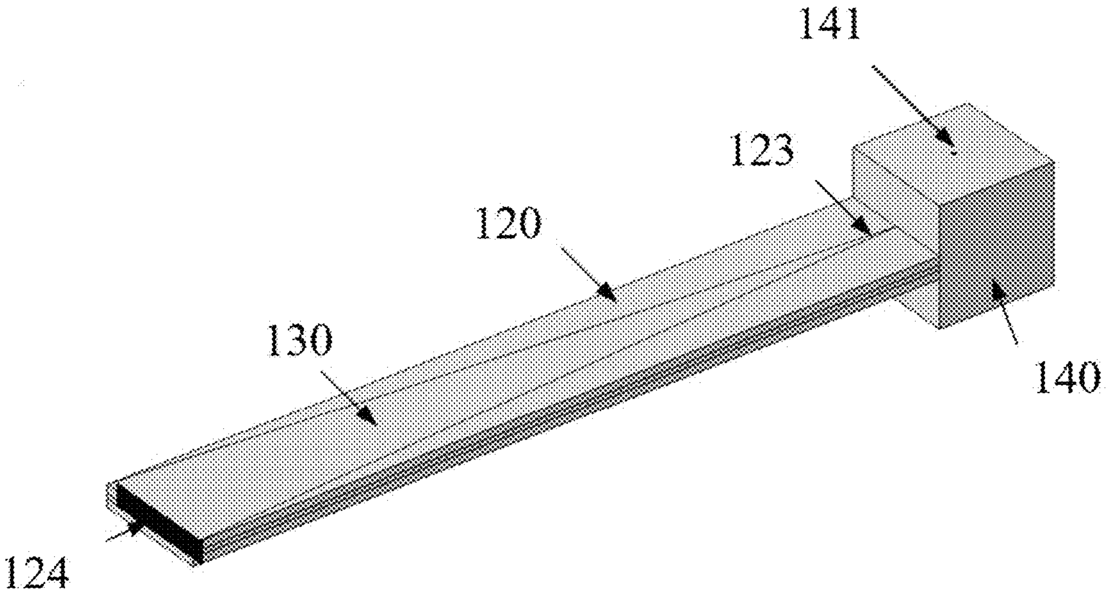
FIG. 10 is a schematic diagram illustrating an exemplary piezoelectric component including a mass block according to some embodiments of the present disclosure.

FIG. 10 is a schematic diagram illustrating an exemplary piezoelectric component 120 including a mass block 140 according to some embodiments of the present disclosure.

In some embodiments, the vibration output region of the piezoelectric component 120 may be connected to the vibration component 110 and/or other components. In some embodiments, the vibration component 110 and/or other components may be simplified as a mass block 140 to design a profile curve of the electrode 130. For example, as shown in FIG. 10, the vibration output region 123 of the piezoelectric component 120 may be connected to the mass block 140. The mass block 140 may transmit vibration and output vibrations through a second vibration output region 141. In some embodiments, the second vibration output region 141 may include a face, an edge, a point, or the like of the mass block 140, or any combination thereof. As shown in FIG. 10, the second vibration output region 141 may include a center point of the mass block 140. The specific implementation of the second vibration output region 141 may be referred to as the relevant description in FIGS. 3-4, which are not repeated here.

In some embodiments, the profile curve of the electrode 130 may be determined according to a mass relationship between the piezoelectric component 120 and the mass block 140 and the vibration structure of the piezoelectric component 120 to perform modal control on the piezoelectric component 120. In some embodiments, the mass relationship between the piezoelectric component 120 and the mass block 140 may include a ratio of a mass of the mass block 140 to a mass of the piezoelectric component 120, that is, the mass ratio $\alpha$. For example, mass ratio $\alpha$ may include 0.25, 0.5, 0.75, 1, 1.5, 2, 2.5, 3, or the like. Taking the piezoelectric cantilever beam shown in FIG. 10 as an example below, several exemplary first-order electrodes 130-1 and second-order electrodes 130-2 are provided to describe the specific implementation of the mass ratio in detail.

Figure 11A:
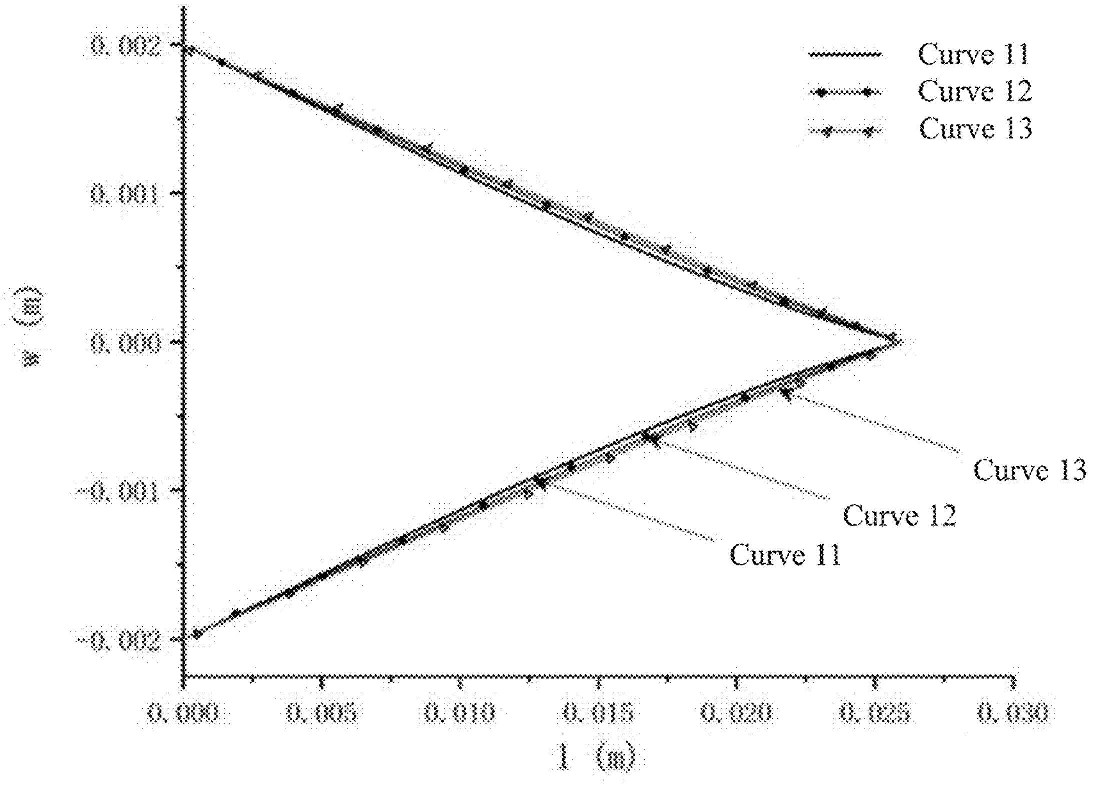
FIG. 11A is a schematic diagram illustrating a shape of an exemplary first-order electrode according to some embodiments of the present disclosure.
Figure 11B:
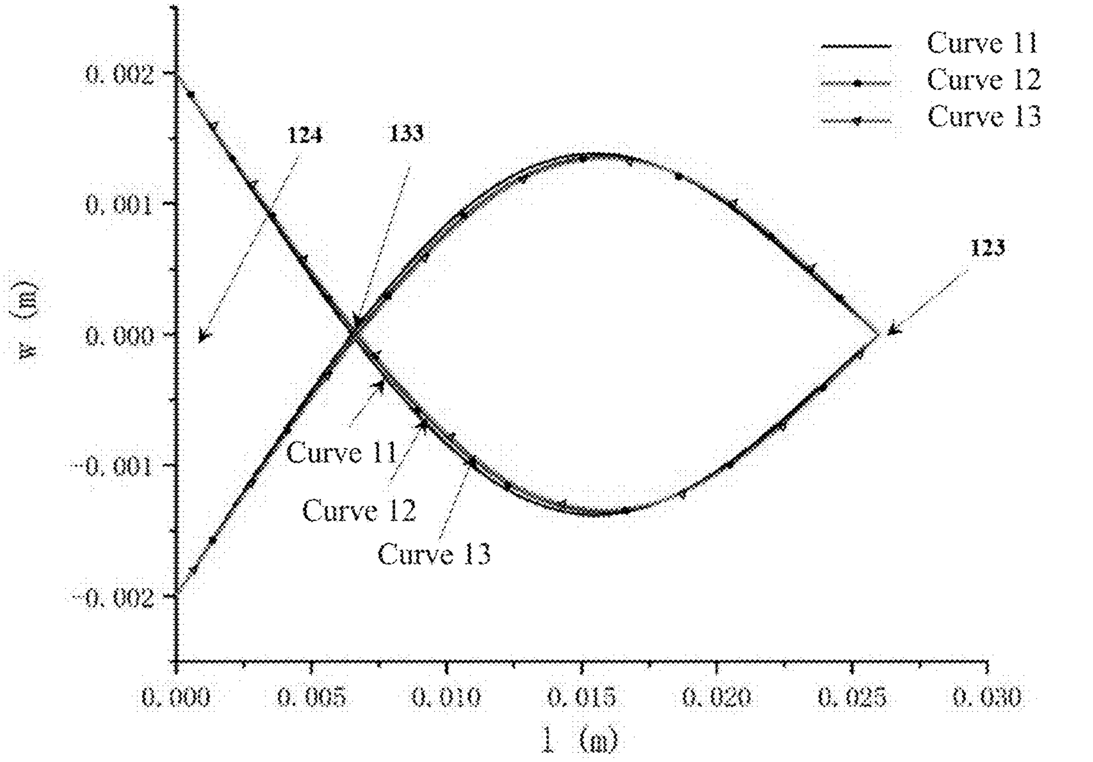
FIG. 11B is a schematic diagram illustrating a shape of an exemplary second-order electrode according to some embodiments of the present disclosure.

FIG. 11A is a schematic diagram illustrating a shape of an exemplary first-order electrode 130-1 according to some embodiments of the present disclosure. FIG. 11B is a schematic diagram illustrating a shape of an exemplary second-order electrode 130-2 according to some embodiments of the present disclosure.

As shown in FIG. 11A, curve 11 is a profile curve of the first-order electrode 130-1 when the mass block 140 with a mass ratio $\alpha$=0.5 is attached, curve 12 is a profile curve of the first-order electrode 130-1 when the mass block 140 with a mass ratio $\alpha$=1 is attached, and curve 13 is a profile curve of the first-order electrode 130-1 when the mass block 140 with a mass ratio $\alpha$=2 is attached. As shown in FIG. 11B, curve 14 is a profile curve of the second-order electrode 130-2 when the mass block 140 with a mass ratio $\alpha$=0.5 is attached, the curve 15 is a profile curve of the second-order electrode 130-2 when the mass block 140 with a mass ratio $\alpha$=1 is attached, and curve 16 is a profile curve of the second-order electrode 130-2 when the mass block 140 with a mass ratio $\alpha$=2 is attached.

In some embodiments, with the change of the mass ratio $\alpha$, the shape of the electrode 130 may also change accordingly. For example, the greater the mass ratio $\alpha$ of the mass block 140 to the piezoelectric component 120, the flatter the change process of the width of the electrode 130 may be. For example, as shown in FIG. 11A, according to curve 11 to curve 13, the mass ratio $\alpha$ of the mass of the mass block 140 to the piezoelectric component 120 may be increasingly great, and the degree of curvature of the profile curve of the first-order electrode 130-1 may become increasingly small, that is, the change of the profile curve of the first-order electrode 130-1 may become increasingly flat.

As another example, as shown in FIG. 11B, according to curve 14 to curve 16, the mass ratio $\alpha$ of the mass of the mass block 140 to the piezoelectric component 120 may be increasingly great, and the degree of curvature of the profile curve of the second-order electrode 130-2 decreases from the fixed region 124 to the transition point 133 may become increasingly small. Moreover, the degree of curvature of the profile curve of the second-order electrode 130-2 may increase from the transition point 133 to the vibration output region 123 becomes increasingly small, and the degree of curvature may become increasingly small. That is, the change of the profile curve of the second-order electrode 130-2 may become increasingly flat. The specific implementation of the profile curve of the electrode 130 may be referred to the relevant description in FIGS. 5A-5D, which is not repeated here.

In some embodiments, in the case of attaching the mass block 140 to the piezoelectric component 120, the mass relationship between the piezoelectric component 120 and the mass block 140 may not be considered. Instead, the profile curve of the electrode 130 may be determined only according to the vibration structure of the piezoelectric component 120, and the piezoelectric component 120 may also be modal controlled. The specific implementation of the electrode design without considering the mass ratio may be referred to the relevant description in FIG. 12-13D below, which is not repeated here.

Figure 12:
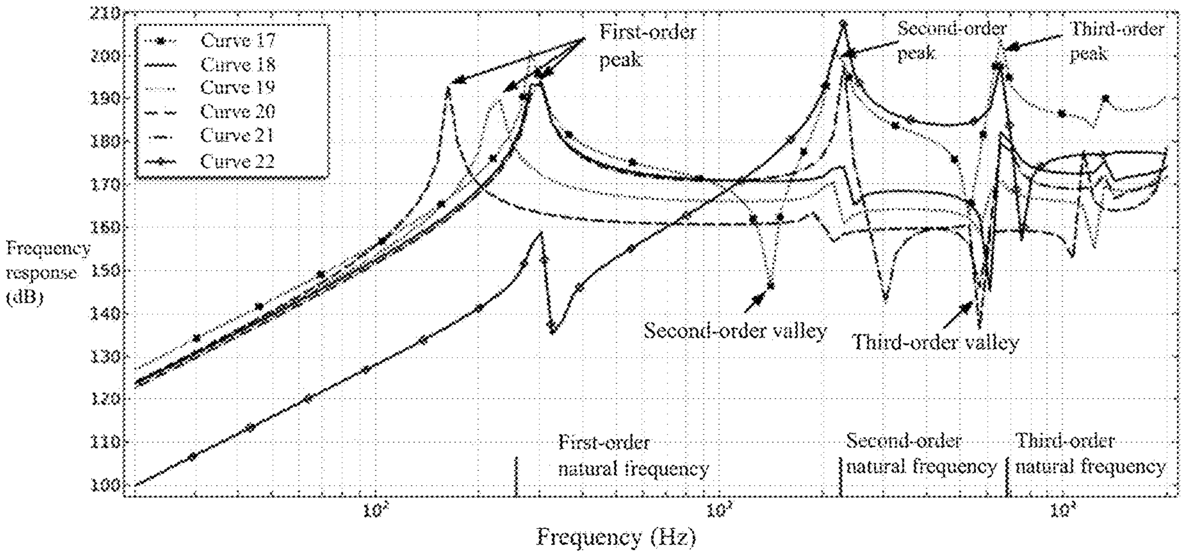
FIG. 12 is a schematic diagram illustrating a comparison of frequency response curves of exemplary piezoelectric components according to some embodiments of the present disclosure.

FIG. 12 is a schematic diagram illustrating a comparison of frequency response curves of exemplary piezoelectric components according to some embodiments of the present disclosure.

As shown in FIG. 12, curve 17 is a frequency response curve of the piezoelectric component 120 with the mass block 140 attached when the electrode 130 completely covers a surface of the piezoelectric component 120 (i.e., the electrode 130 and the piezoelectric component 120 coincide and are rectangular). Curve 18 is a frequency response curve of the piezoelectric module 120 when the mass block 140 with the mass ratio $\alpha$=0.5 is attached and covers the first-order electrode 130-1 as shown in FIG. 11A. Curve 19 is a frequency response curve of the piezoelectric module 120 when the mass block 140 with the mass ratio $\alpha$=1 is attached and covers the first-order electrode 130-1 as shown in FIG. 11A. Curve 20 is a frequency response curve of the piezoelectric module 120 when the mass block 140 with the mass ratio $\alpha$=2 is attached and covers the first-order electrode 130-1 as shown in FIG. 11A. Curve 21 is a frequency response curve of the piezoelectric module 120 covers the first-order electrode 130-1 as shown in FIG. 5A (i.e., the electrode shape calculated without the mass block 140 attached) but still attaches the mass block 140 with the mass ratio $\alpha$=0.5. Curve 22 is a frequency response curve of the piezoelectric module 120 when the mass block 140 with the mass ratio $\alpha$=0.5 is attached and covers the second-order electrode 130-2 as shown in FIG. 11B.

As shown in FIG. 12, curve 17 has a first-order peak and a second-order valley, which may reflect that when the electrode 130 completely covers a surface of the piezoelectric component 120 (i.e., the electrode 130 and the piezoelectric component 120 coincide) and attaches the mass block 140, the piezoelectric component 120 still has multiple modes.

As shown in FIG. 12, after the first-order electrode 130-1 designed by attaching the mass block 140, the piezoelectric components 120 shown in curve 18 and curve 20 smoothly transition from the first-order peak to the second-order peak frequency (e.g., around 1000 Hz), a weak jump occurs at the second-order peak frequency, and then continues to smoothly transition to the third-order valley. Moreover, at the second-order peak frequency and the third-order peak frequency (e.g., around 7000 Hz), the amplitude of the frequency response curve of the piezoelectric component 120 shown in the curve 18 to the curve 20 are significantly reduced.

In addition, as the mass ratio $\alpha$ increase, the frequency corresponding to the first-order peak of the frequency response curve of the piezoelectric component 120 shown in curve 18-curve 20 is getting increasingly low, the amplitude from the first-order peak to the rear is also getting increasingly low, and the changing trend of the frequency response curve after jumping at the second-order peak frequency is getting increasingly straight, which may reflect that the greater the mass ratio $\alpha$, the better the modal control effect of the piezoelectric component 120 that covers the first-order electrode 130-1 designed with the mass block 140 attached.

As shown in FIG. 12, after covering the first-order electrode 130-1 designed without the mass block 140 attached, the frequency response curve of the piezoelectric component when the mass block 140 with the mass ratio $\alpha$=0.5 is attached shown in curve 21 may smoothly transition at the frequency corresponding to the second-order valley, but the amplitude and bandwidth of the jump at the second-order peak frequency are significantly increased, which may reflect that the first-order electrode 130-1 designed without the mass block 140 attached may still realize the modal control of the second-order valley of the piezoelectric component 120, but the suppression effect on the higher-order vibration mode may be weakened.

After adopting the second-order electrode 130-2 designed with the mass block 140 attached, the frequency response curve of the piezoelectric component 120 shown in curve 22 is similar to the frequency response curve of the piezoelectric component 120 without the mass block 140 attached as shown in curve 3 in FIG. 6. It is in the second-order vibration mode from the low-frequency stage (e.g., 0-100 hz), and a narrow-band jump of the curve occurs at the first-order peak frequency (e.g., between 100 Hz and 200 Hz), reducing the first-order peak amplitude. After the peak frequency, until the third-order peak frequency (such as between 6000 Hz and 7000 hz) is in the second-order vibration mode, which may reflect that the piezoelectric component 120 covers the second-order electrode 130-2 (the potentials of the two envelope regions are opposite) designed with the mass block 140 with the mass ratio $\alpha$=0.5 attached can control the second-order vibration mode.

Figure 13A:
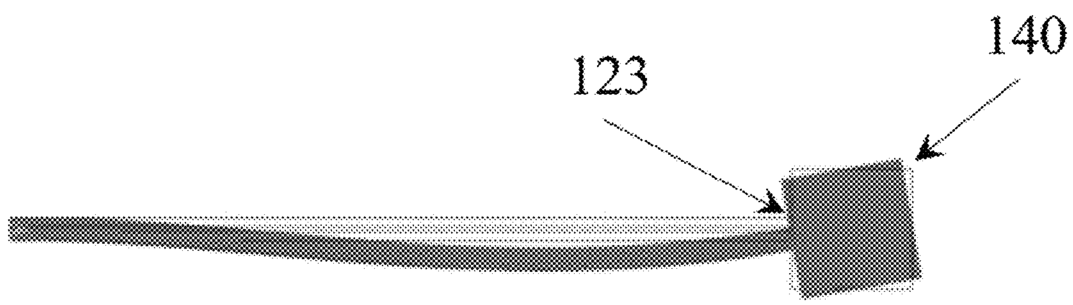
FIG. 13A is a vibration mode of a piezoelectric component having a mass block at a second-order valley frequency and an electrode is completely covered on a surface of the piezoelectric component (i.e., the electrode and the piezoelectric component coincide) according to some embodiments of the present disclosure.
Figure 13B:
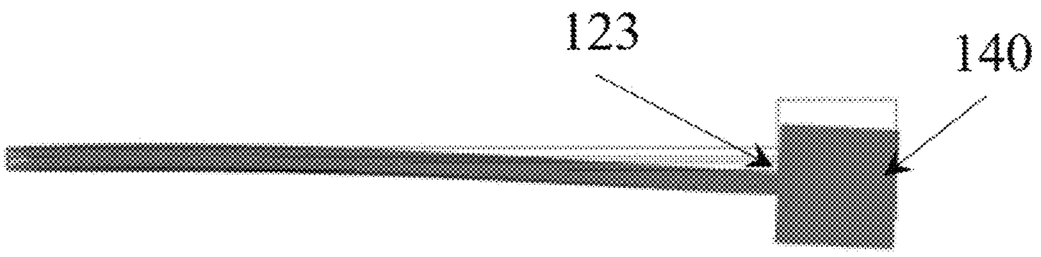
FIG. 13B is a vibration mode of a piezoelectric component including a first-order electrode that is designed by attaching a mass block at a second-order valley frequency according to some embodiments of the present disclosure.
Figure 13C:
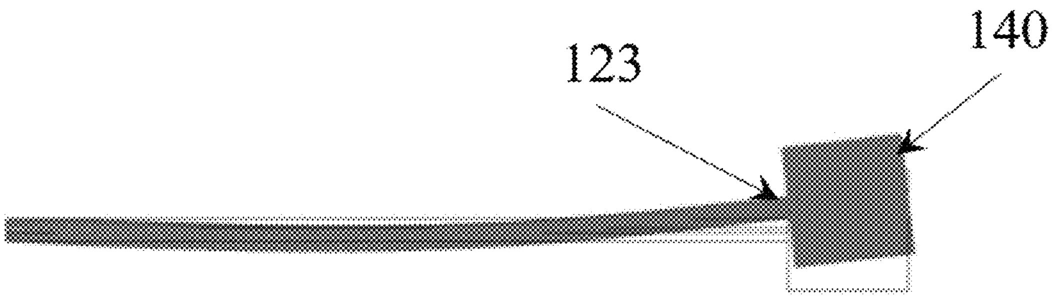
FIG. 13C is a vibration mode of a piezoelectric component including a second-order electrode that is designed by without attaching a mass block at a second-order valley frequency according to some embodiments of the present disclosure.
Figure 13D:
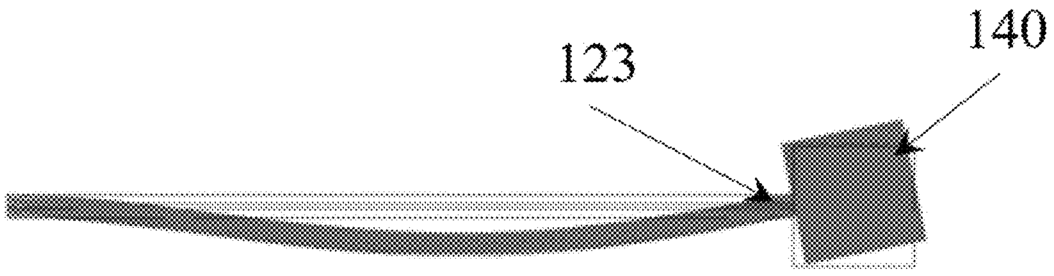
FIG. 13D is a vibration mode of a piezoelectric component including a second-order electrode that is designed by attaching a mass block at a second-order valley frequency according to some embodiments of the present disclosure.

FIG. 13A is a vibration mode of a piezoelectric component with a mass block 140 attached at a second-order valley frequency and an electrode is completely covered on a surface of the piezoelectric component 120 (i.e., the electrode and the piezoelectric component coincide) according to some embodiments of the present disclosure. FIG. 13B is a vibration mode of the piezoelectric component 120 including a first-order electrode that is designed by attaching a mass block at a second-order valley frequency according to some embodiments of the present disclosure. FIG. 13C is a vibration mode of the piezoelectric component 120 including a second-order electrode 130-2 that is designed by without attaching a mass block at a second-order valley frequency according to some embodiments of the present disclosure. FIG. 13D is a vibration mode of the piezoelectric component 120 including a second-order electrode 130-2 that is designed by attaching a mass block at a second-order valley frequency according to some embodiments of the present disclosure.

Referring to FIG. 12 and FIGS. 16A-16D, when the electrode is completely covered on a surface of the piezoelectric component (i.e., the rectangular electrode coincides with the rectangular piezoelectric component) at the second-order valley frequency (e.g., 1411 HZ), the vibration response of the piezoelectric component 120 with the mass block 140 attached fluctuates greatly during the vibration process, the frequency response curve is not flat, and the vibration output region 123 may form nodes at certain frequencies, affecting the effect of acoustic output. Instead, when the first-order electrode 130-1 is designed with the mass block 140 attached (or the first-order electrode 130-1 and the second-order electrode 130-2 designed with the mass block 140 attached or the first-order electrode 130-1 designed without the mass block 140 attached) is adopted, the vibration response of the piezoelectric component 120 with the mass block 140 attached fluctuates less, the frequency response curve may be flat, and it may be difficult to form a node.

In addition, as shown in FIG. 13C, when the first-order electrode 130-1 designed without the mass block 140 attached is covered, the vibration mode of the piezoelectric component 120 with the mass block 140 attached will show a tendency to change to the second-order vibration mode during the vibration process, which may reflect that the first-order electrode 130-1 designed without the mass block 140 attached may still realize the modal control of the piezoelectric component 120, but a suppression effect on the high-order vibration mode may be weakened.

In some embodiments, the electrode 130 may be designed based on the mass ratio α of the mass block 140 and the piezoelectric component 120, so that the piezoelectric component 120 may generate an accurate excitation force of a specific mode, and further improving the modal control effect. Moreover, the amplitude of the frequency response curve of the piezoelectric component 120 at a fixed frequency may be reduced, the vibration output region 123 of the piezoelectric component 120 may be prevented from forming a node, and the working reliability of the acoustic device 100 may be improved.

In some embodiments, the piezoelectric component 120 may include a piezoelectric plate or a piezoelectric film. In some embodiments, the shape of the electrode 130 may be determined according to the size of the piezoelectric plate or the piezoelectric film and the vibration mode function of the vibration structure. For example, the electrode 130 may be covered on the piezoelectric plate or the piezoelectric film may be designed as a plurality of discrete electrode units distributed in two dimensions (also referred to as "two-dimensional electrodes"), so that the piezoelectric component 120 may generate the specific mode.

Taking the piezoelectric component 120 shown in FIG. 4 as an example below, exemplary discrete electrode units 134 and continuous electrodes are provided respectively to describe the specific implementation of the design of the two-dimensional electrode in detail.

In some embodiments, the electrode 130 may include a plurality of discrete electrode units 134 distributed in two dimensions. In some embodiments, the plurality of discrete electrode units 134 may be configured to be separated from each other and distributed in a conductive material of the surface of the piezoelectric component 120. In some embodiments, the shape of the discrete electrode unit 134 may include one or any combination of circular, triangular, quadrilateral, irregular, or the like.

FIG. 14 A is schematic diagram illustrating a partial structure of an exemplary two-dimensional electrode 130 according to some embodiments of the present disclosure; FIG. 14 B is a schematic diagram illustrating a partial structure of an exemplary two-dimensional electrode 130 according to some embodiments of the present disclosure; FIG. 14C is a schematic diagram illustrating a partial structure of an exemplary two-dimensional electrode 130 according to some embodiments of the present disclosure; FIG. 14D is a schematic diagram illustrating a partial structure of an exemplary two-dimensional electrode 130 according to some embodiments of the present disclosure.

Figure 14A:
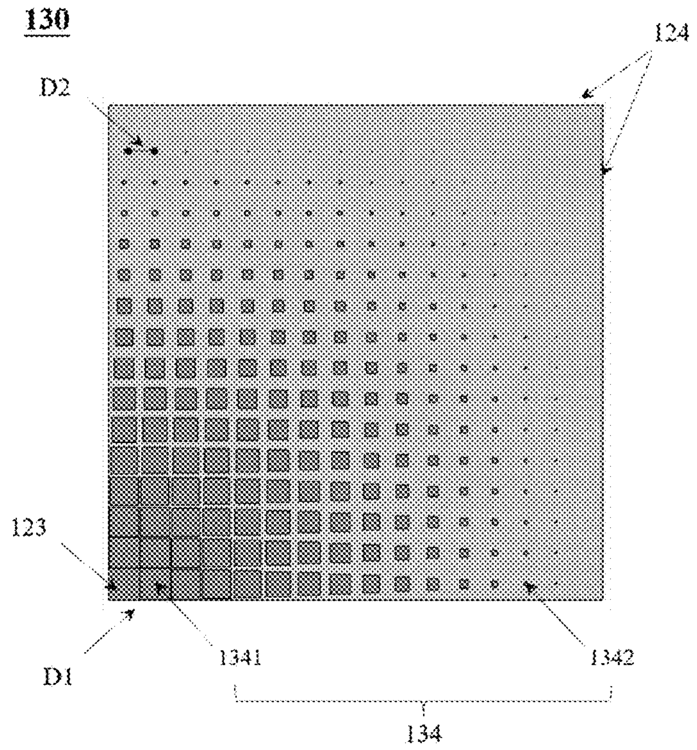
FIG. 14A is a schematic diagram illustrating a partial structure of an exemplary two-dimensional electrode according to some embodiments of the present disclosure.
Figure 14B:
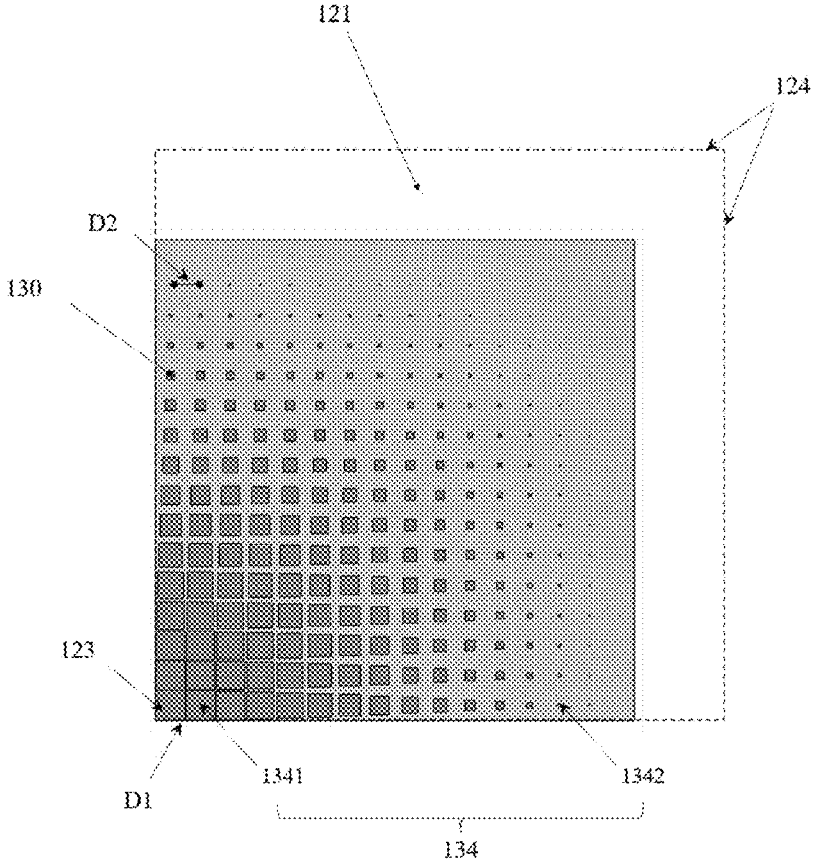
FIG. 14B is a schematic diagram illustrating a partial structure of an exemplary two-dimensional electrode according to some embodiments of the present disclosure.
Figure 14C:
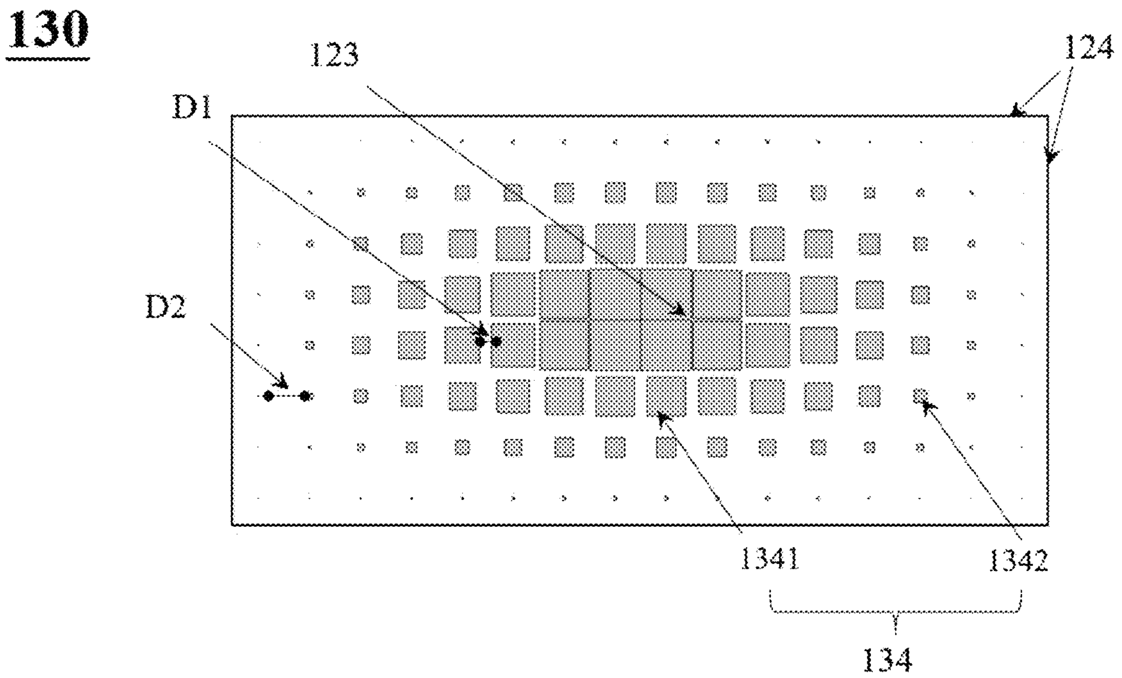
FIG. 14C is a schematic diagram illustrating a partial structure of an exemplary two-dimensional electrode according to some embodiments of the present disclosure.
Figure 14D:
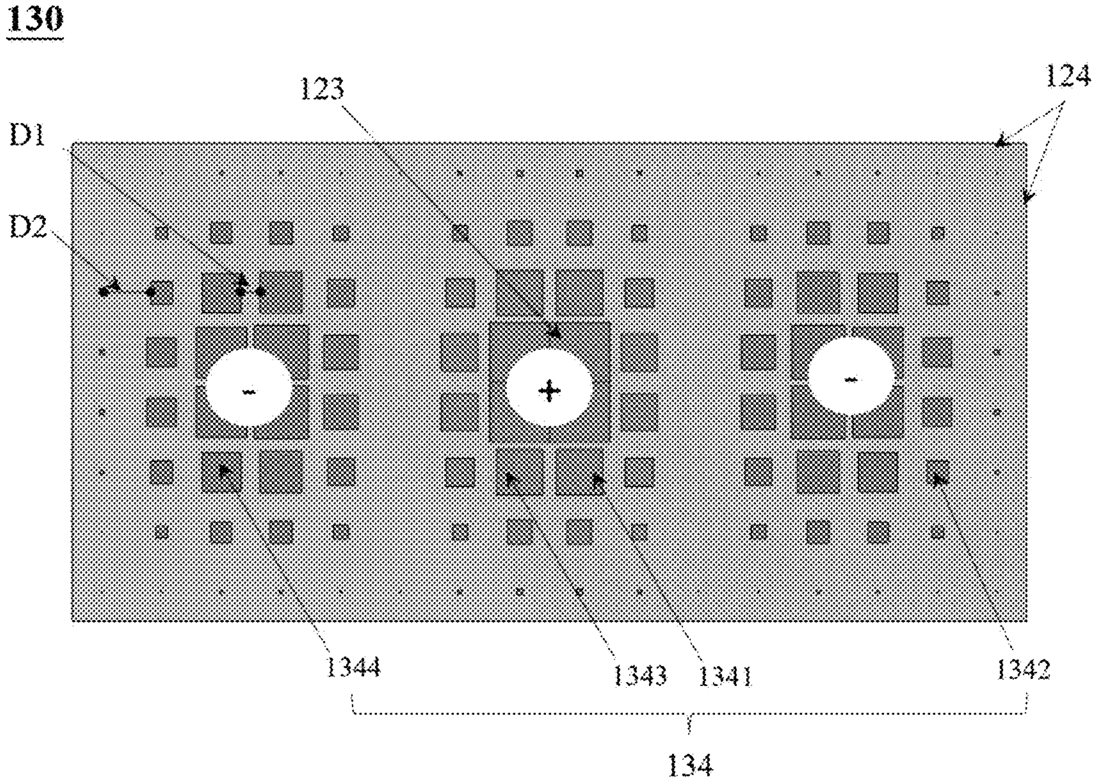
FIG. 14D is a schematic diagram illustrating a partial structure of an exemplary two-dimensional electrode according to some embodiments of the present disclosure.

FIG. 14A shows a quarter of a square piezoelectric layer, the piezoelectric layer 122 (e.g., a square piezoelectric sheet with dimensions of 18×18×0.09 mm) and the substrate 121 (e.g., a steel substrate with dimensions of 18×18×0.05 mm) may coincide, and a peripheral edge of the substrate may be the fixed region 124. FIG. 14B shows a quarter of the square piezoelectric layer, the piezoelectric layer 122 (e.g., a square piezoelectric sheet with dimensions of 18×18×0.09 mm) may be covered on the substrate 121 (e.g., a steel sheet with dimensions of 23×23×0.05 mm), the coverage area of the piezoelectric layer 122 may be less than the area of the surface of the substrate 121 covered with the piezoelectric layer, and the peripheral edge of the substrate may be the fixed region 124. FIG. 14C and FIG. 14D show a rectangular piezoelectric layer, respectively, the piezoelectric layer 122 (e.g., a rectangular piezoelectric plate with dimensions of 40×20×0.5 mm) and the substrate 121 (e.g., a steel substrate with dimensions of 40×20×0.1 mm) may coincide, and the peripheral edge of the substrate may be the fixed region 124. The rectangular piezoelectric plate shown in FIG. 14D is in (3,1) modality. The "3" in "(3,1) modality" in the present disclosure may refer to a third-order vibration mode in the length direction, that is, when the rectangular piezoelectric plate is simplified as a cantilever beam along the length direction (ignoring the existence of width), it may have the third-order vibration mode; "1" may refer to a first-order vibration mode in the width direction, that is, when the rectangular piezoelectric plate is simplified as a cantilever beam along the width direction (ignoring the existence of length), it may have the first-order vibration mode.

In some embodiments, among the plurality of discrete electrode units 134, a gap between two adjacent discrete electrode units 134 at a center of the piezoelectric layer 122 may be less than a gap between two adjacent discrete electrode units 134 at a boundary of the piezoelectric layer 122. The "center of the piezoelectric layer 122" mentioned here may be a geometric center of the piezoelectric layer 122, a vibration amplitude output position of each mode of the piezoelectric layer 122, or a center of the vibration output region 123. For example, when the piezoelectric layer 122 is in the (3,1) modality, the center of the piezoelectric layer 122 may include three, each center corresponds to a vibration center of each order vibration mode. Accordingly, the "boundary of the piezoelectric layer 122" mentioned herein may be a geometric boundary of the piezoelectric layer 122, a region where the vibration output of each modality of the piezoelectric layer 122 is the smallest, or a boundary of the fixed region 124. For example, when the piezoelectric layer 122 is in the (3,1) modality (i.e., the third-order vibration mode in the length direction and the first-order vibration mode in the width direction), the boundary of the piezoelectric layer 122 may be the boundary of the region corresponding to each vibration modality. For example, as shown in FIGS. 14A-14C, a gap between two adjacent discrete electrode units 134 at the geometric center of the piezoelectric layer 122 may be a distance D1, and a gap between the two adjacent discrete electrode units 134 at the boundary may be a distance D2, and the distance D1 may be less than the distance D2. For example, as shown in FIG. 14D, the gap between the two adjacent discrete electrode units 134 at each vibration center of the piezoelectric layer 122 may be the distance D1, and the gap between the two adjacent discrete electrode units 134 at the boundary of the region corresponding to the vibration center may be the distance D2, and the distance D1 may be less than the distance D2. In some embodiments, the gap between the two adjacent discrete electrode units gradually increases from the center of the piezoelectric layer 122 to the boundary. For example, the gap between the two adjacent discrete electrode units near the center of the piezoelectric layer 122 may be less than the gap between the two adjacent discrete electrode units far from the center of the piezoelectric layer 122.

In some embodiments, an area of the discrete electrode unit 134 may be related to the vibration displacement value of the region where it is located at a specific frequency (e.g., a first-order peak, a second-order peak). A vibration displacement value may refer to a change in the distance of the piezoelectric layer 122 in the horizontal plane during the vibration process compared to the vibration is not performed. In some embodiments, the area of the first discrete electrode unit 1341 at the center of the piezoelectric layer 122 may be greater than the area of the second discrete electrode unit 1342 at the boundary of the piezoelectric layer 122. For example, as shown in FIGS. 14A-14D, since the first discrete electrode unit 1341 is closer to the vibration output region 123 than the second discrete electrode unit 1342, the displacement value of the first discrete electrode unit 1341 may be greater than the displacement value of the second discrete electrode unit 1342 during vibration, and the area of the first discrete electrode unit 1341 may be greater than the area of the second discrete electrode unit 1342.

In some embodiments, at a specific frequency (e.g., first-order peak and second-order peak) the area of the discrete electrode unit 134 in each region may be determined based on a difference (e.g., a displacement ratio) between a vibration displacement value of the region where the discrete electrode unit 134 is located and a maximum displacement value of the piezoelectric layer 122. Exemplarily, the piezoelectric layer 122 may be discretized into m×n piezoelectric sub-regions, i.e., m×n discrete electrode units 134. Based on the difference between the displacement value of each piezoelectric sub-region and the maximum displacement value of the piezoelectric layer 122, the piezoelectric sub-region is scaled equally to determine the area of the discrete electrode unit 134 in the piezoelectric sub-region.

In some embodiments, the potential of the discrete electrode unit 134 may be related to the displacement direction of the piezoelectric sub-region in which it is located. For example, as shown in FIG. 14D, during the vibration of the piezoelectric component 120, if the displacement direction of the third discrete electrode unit 1343 is opposite to the maximum displacement direction of the piezoelectric layer 122, and the displacement direction of the fourth discrete electrode unit 1344 is the same as the maximum displacement direction of the piezoelectric layer 122, the potential direction of the third discrete electrode unit 1343 may be opposite to the potential direction of the fourth discrete electrode unit 1344.

Taking the size of the piezoelectric component 120 and the substrate shown in FIGS. 14A and 14B as an example, the following describes the difference in the frequency response curves when different shapes or numbers of discrete electrode units are respectively covered on the piezoelectric component 120.

Figure 15A:
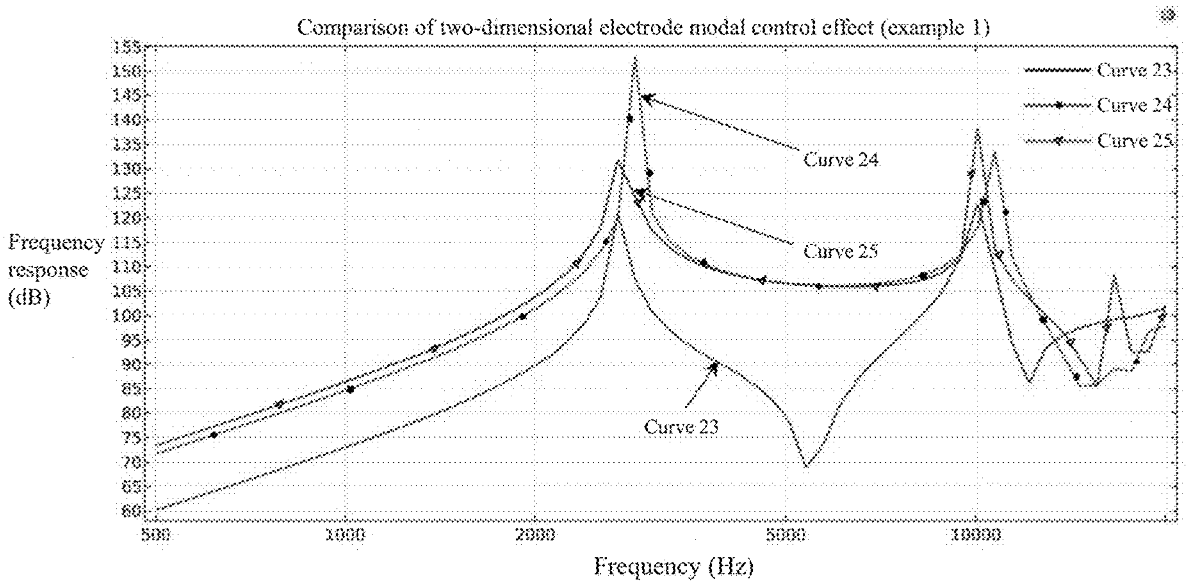
FIG. 15A is a schematic diagram illustrating a comparison of frequency response curves of exemplary piezoelectric components according to some embodiments of the present disclosure.
Figure 15B:
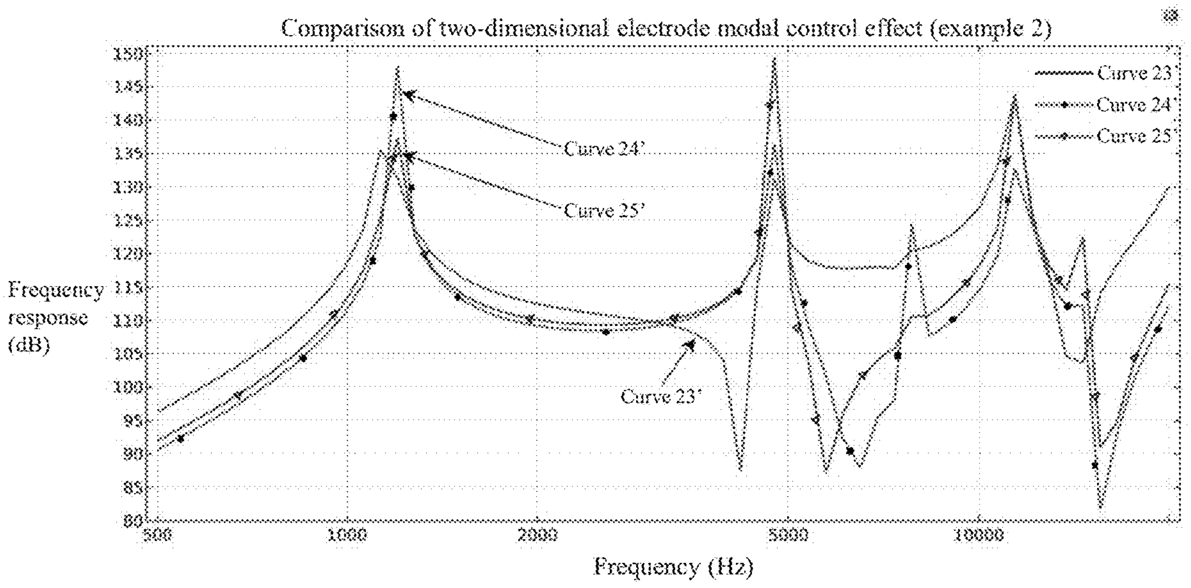
FIG. 15B is a schematic diagram illustrating a comparison of frequency response curves of exemplary piezoelectric components according to some embodiments of the present disclosure.

FIG. 15A is a schematic diagram illustrating a comparison of frequency response curves of exemplary piezoelectric components according to some embodiments of the present disclosure; FIG. 15B is a schematic diagram illustrating a comparison of frequency response curves of exemplary piezoelectric components according to some embodiments of the present disclosure; FIG. 15 C is a schematic diagram illustrating a vibration displacement at 5380.3 Hz of a piezoelectric component covered with an integral electrode according to some embodiments of the present disclosure; FIG. 15D is a schematic diagram illustrating a vibration displacement at 5380.3 Hz of a piezoelectric component covered with 8×8 discrete electrode units according to some embodiments of the present disclosure.

As shown in FIG. 15A, curve 23 is a frequency response curve of the piezoelectric component 120 when the piezoelectric layer 122 and the substrate 121 coincide as shown in FIG. 14A, i.e., the electrode 130 may be completely covered on a surface of the piezoelectric component 120 (i.e., the integral electrode). Curve 24 is a frequency response curve of the piezoelectric component 120 covered with 8×8 discrete electrode units 134 when the piezoelectric layer 122 and the substrate 121 coincide as shown in FIG. 14A. Curve 25 is a frequency response curve of the piezoelectric component 120 covered with 32×32 discrete electrode units 134 when the piezoelectric layer 122 and the substrate 121 coincide as shown in FIG. 14A.

As shown in FIG. 15A, the frequency response curve of the piezoelectric component 120 shown in curve 23 may generate a resonance valley, and a split vibration may be generated at the frequency corresponding to the resonance valley (e.g., about 5380.3 Hz), which may reflect that when the electrode 130 completely is covered on a surface of the piezoelectric component 120, the central region of the piezoelectric layer 122 is in inverse phase to the surrounding vibration and the vibration area may be the same, and it may be easy to cause the radiated sound pressure of the piezoelectric component 120 inverse phase cancellation in the vibration output region, making it difficult to output vibration.

The frequency response curves of the piezoelectric component 120 shown in curve 24 to curve 25 may form a smooth sound pressure level frequency response curve between a first-order peak (e.g. at 3500 Hz) and a second-order peak (e.g. at about 10000 Hz), and increase the amplitude near the resonance valley frequency, which may reflect that the two-dimensional electrode 130 may expand the frequency band of a piston vibration of the piezoelectric component 120, so that it may still maintains a first-order piston vibration at the frequency corresponding to the original resonance valley (e.g. at about 5380.3 Hz), and may effectively output the radiation sound pressure to realize modal control. The "piston vibration" in the present disclosure may refer to that each region of the piezoelectric component 120 (e.g., a piezoelectric plate) exhibits simultaneously up and down vibration (displacement direction is the same) when vibrating, just like a piston.

In addition, a low-frequency amplitude of the frequency response curves of the piezoelectric component 120 shown in curve 24-curve 25 before the first-order peak (e.g., before 2000 Hz) may be also increased, and the overall bandwidth of the second-order peak and the resonance valley thereafter (such as after 10000 hz) may be also reduced, which may reflect that the two-dimensional electrode 130 may improve the low-frequency response of the piezoelectric component 120 and suppress the natural vibration mode of the piezoelectric component 120 at the second-order peak frequency.

Furthermore, the frequency response curve of the piezoelectric component 120 shown in curve 25 may have a higher low-frequency response amplitude before the first-order peak (e.g., before 2000 Hz) than the frequency response curve of the piezoelectric component 120 shown in curve 24. The amplitude and bandwidth at the second-order peak frequency (e.g., around 10000 Hz) may be suppressed, which may reflect that compared with covering 8×8 two-dimensional electrodes 130, the piezoelectric component 120 covering 32×32 two-dimensional electrodes 130 may have a higher low-frequency response and may also suppress the high-frequency mode.

As shown in FIG. 15B, curve 23' is a frequency response curve of the piezoelectric component 120 when the coverage area of the piezoelectric layer 122 is less than the area of the surface of the substrate 121 covered with the piezoelectric layer and the electrode 130 is completely covered on a surface (i.e., the entire electrode) of the piezoelectric component 120 as shown in FIG. 14B; curve 24' is a frequency response curve of the piezoelectric component 120 covered with 8×8 discrete electrode units 134 when the coverage area of the piezoelectric layer 122 is less than the surface area of the substrate 121 covered with the piezoelectric layer as shown in FIG. 14B; curve 25' is a frequency response curve of the piezoelectric component 120 covered with 32×32 discrete electrode units 134 when the coverage area of the piezoelectric layer 122 is less than the surface area of the substrate 121 covered with the piezoelectric layer as shown in FIG. 14B.

As shown in FIG. 15B, the frequency response curve of the piezoelectric component 120 shown in the curve 23' generates split vibration at 4189.8 Hz, and the vibration mode may be similar to that of the curve 23 so that the sound pressure in the vibration output region may be inverse phase cancellation, forming a resonance valley. According to the curve 24 'and the curve 25', the two-dimensional electrode may expand the frequency band of piston vibration, and the piston vibration may be still at the frequency point of the original resonance valley so that the sound pressure level smoothly transition in this frequency band. The frequency response curve of the piezoelectric component 120 shown in the curve 23 'may be a flat curve at the sound pressure level around 6000 Hz after the second-order peak, while the curve 24' and the curve 25' form a resonance valley after using the two-dimensional electrode. The reason for this phenomenon may be that for the integral electrode, the vibration mode may be that the part of the substrate 121 that exceeds the piezoelectric layer 122 resonates, thereby outputting vibrations. The two-dimensional electrode changes the vibration mode of the piezoelectric layer 122. When the piezoelectric layer 122 is elastically coupled with the edge substrate 121, a vibration mode of the opposite phase vibration in the central region and the surrounding region is formed, and the inverse phase cancellation of the sound pressure in the vibration output region is generated, which is shown as the resonance valley on the curve and also has a certain impact on the directivity.

Figure 15C:
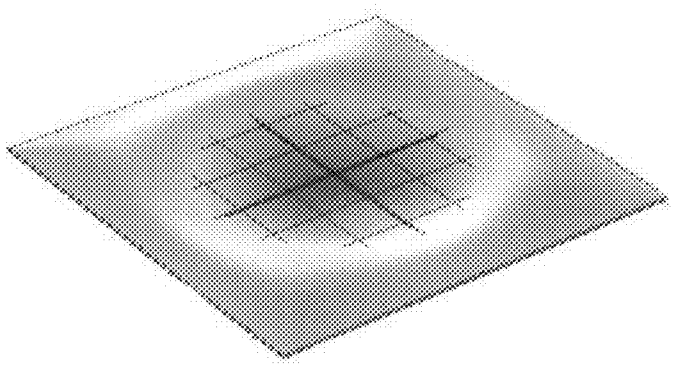
FIG. 15C is a schematic diagram illustrating a vibration displacement at 5380.3 Hz of a piezoelectric component covering an integral electrode according to some embodiments of the present disclosure.
Figure 15D:
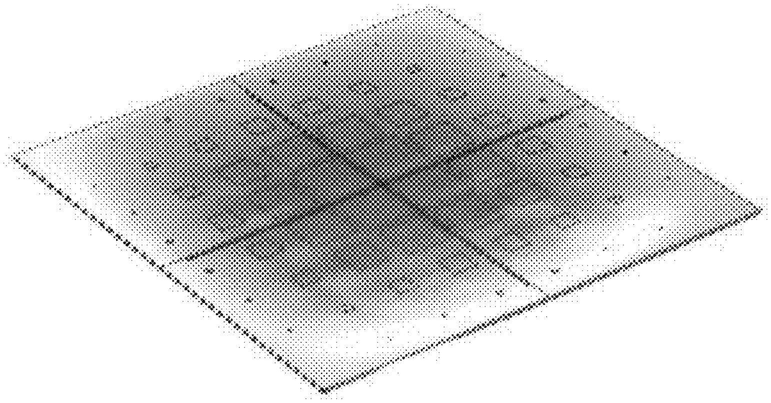
FIG. 15D is a schematic diagram illustrating a vibration displacement at 5380.3 Hz of a piezoelectric component covering 8×8 discrete electrode units according to some embodiments of the present disclosure.

As shown in FIG. 15C and FIG. 15D, the piezoelectric component 120 generates split vibration at 5380.3 Hz when covered with the integral electrode, and the vibration in the central region and the surrounding region are in inverse phases and have the same area, resulting in the inverse phase cancellation of the sound pressure in the vibration output region; while covered with 8×8 discrete two-dimensional electrodes of the electrode unit 134, the piezoelectric component 120 may be still in piston vibration at 5380.3 Hz, effectively outputting the sound pressure, which significantly improves the amplitude of the sound pressure level in the vibration output region.

Figure 16A:
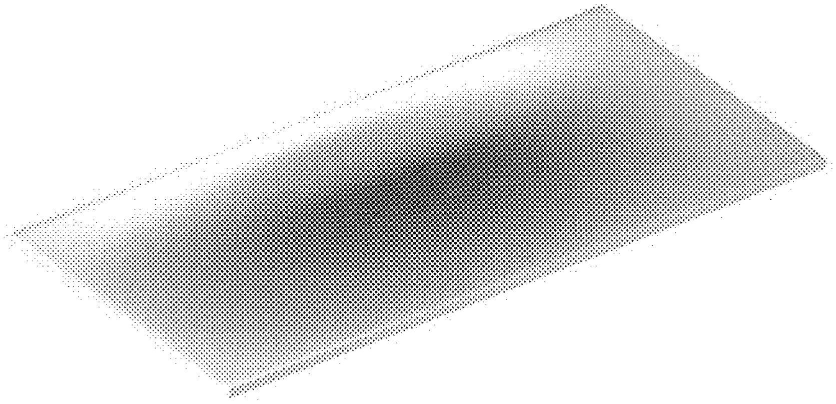
FIG. 16A is a vibration mode illustrating a first-order vibration mode of a rectangular piezoelectric component when an electrode is completely covered the rectangular piezoelectric component (i.e., an integral electrode) according to some embodiments of the present disclosure.
Figure 16B:
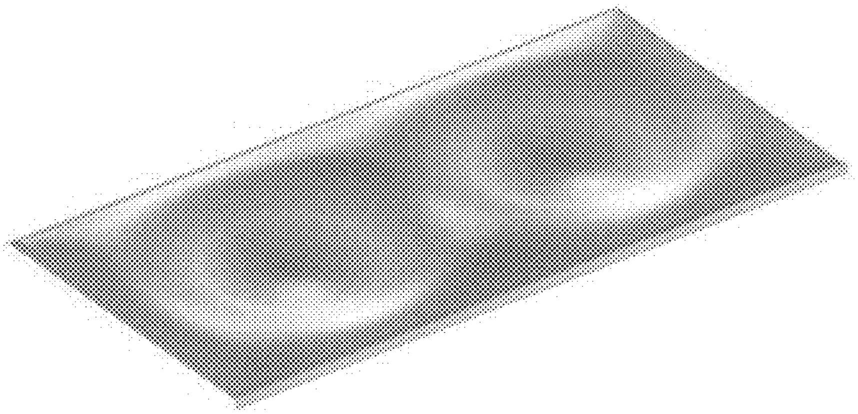
FIG. 16B is a vibration mode of a rectangular piezoelectric component when an electrode is completely covered on the rectangular piezoelectric component (i.e., the whole electrode) at high frequencies according to some embodiments of the present disclosure.
Figure 16C:
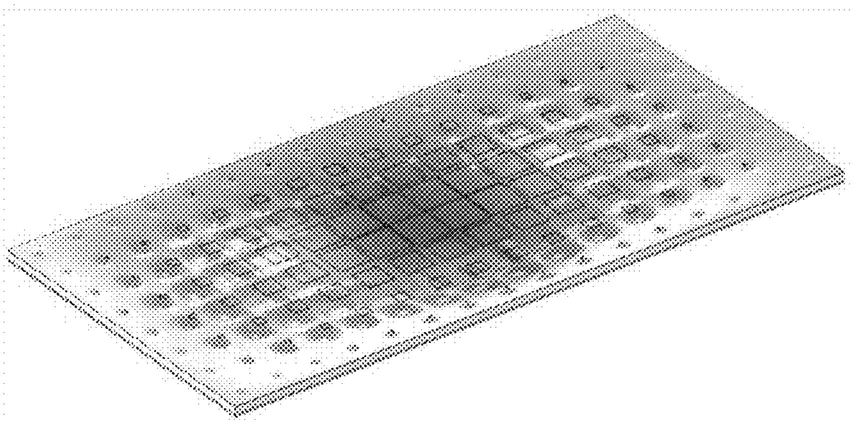
FIG. 16C is a vibration mode of a piezoelectric component covering a two-dimensional electrode including 16×8 discrete electrode units at high frequencies according to some embodiments of the present disclosure.
Figure 16D:
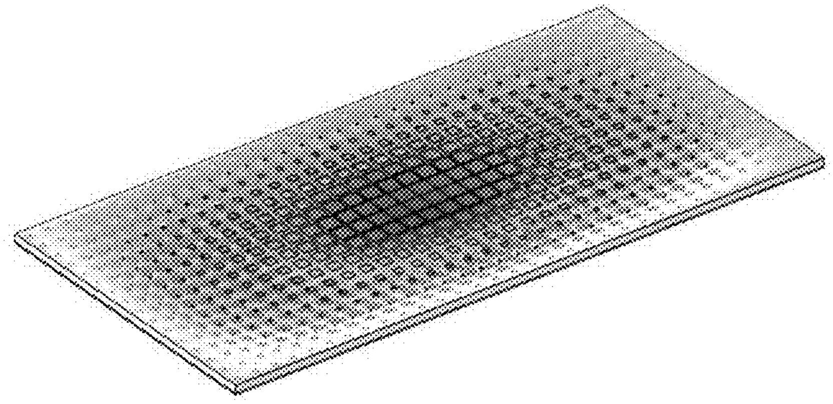
FIG. 16D is a vibration mode of a piezoelectric component covering a two-dimensional electrode including 32×16 discrete electrode units at high frequencies according to some embodiments of the present disclosure.

FIG. 16A is a vibration mode illustrating a first-order mode vibration of a rectangular piezoelectric component 120 when the electrode is completely covered on the rectangular piezoelectric component 120 (i.e., the integral electrode) according to some embodiments of the present disclosure; FIG. 16B is a vibration mode of a rectangular piezoelectric component 120 when an electrode is completely covered on the rectangular piezoelectric component 120 (i.e., the whole electrode) at high frequencies according to some embodiments of the present disclosure; FIG. 16C is a vibration mode of a piezoelectric component 120 covering a two-dimensional electrode 130 including 16×8 discrete electrode units 134 at high frequencies according to some embodiments of the present disclosure; FIG. 16D is a vibration mode of a piezoelectric component 120 covering a two-dimensional electrode including 32×16 discrete electrode units at high frequencies according to some embodiments of the present disclosure.

FIG. 16A shows the first-order vibration mode at 6907 Hz of the rectangular piezoelectric component 120 covering the integral electrode. The vibration mode of the rectangular piezoelectric component 120 covering the integral electrode at a higher frequency of 18326 Hz is shown in FIG. 16B. By covering the two-dimensional electrode 130, the vibration mode at 18326 Hz exhibits a first-order vibration mode similar to that shown in FIG. 16A. Since 32×16 discrete electrical units have more discrete electrical units than 16×8, which are closer to continuous changes, the vibration mode of the piezoelectric component 120 covered with 32×16 discrete electrode units at 18326 Hz is closer to the first-order vibration mode.

In some embodiment, the two-dimensional distribution of the plurality of discrete electrode units 134 is used to realize the design of the two-dimensional electrodes 130, so that the piezoelectric component 120 may output a specific vibration mode, further improving the sound characteristics of the acoustic device 100.

Moreover, the frequency response curve of the piezoelectric component 120 may be stable, so as to prevent the vibration output region 123 from forming a node due to the vibration inversion between the center region and the surrounding region of the piezoelectric component 120, thereby improving the operational reliability of the acoustic device 100.

Figure 17A:
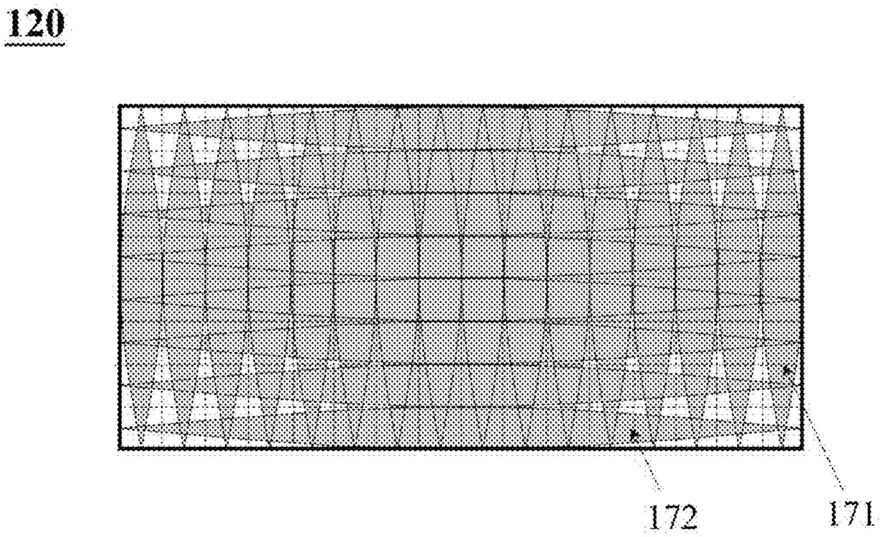
FIG. 17A is a schematic diagram illustrating an exemplary two-dimensional electrode including discrete electrode units according to some embodiments of the present disclosure.
Figure 17B:
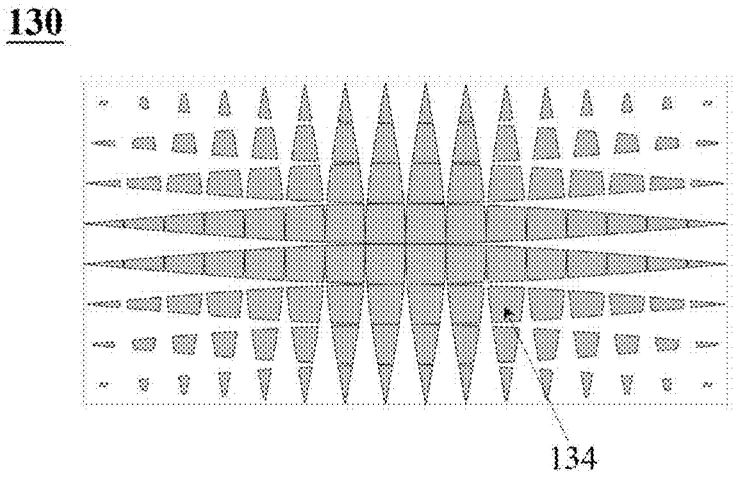
FIG. 17B is a schematic diagram illustrating an exemplary discrete electrode unit of a two-dimensional electrode according to some embodiments of the present disclosure.
Figure 17C:
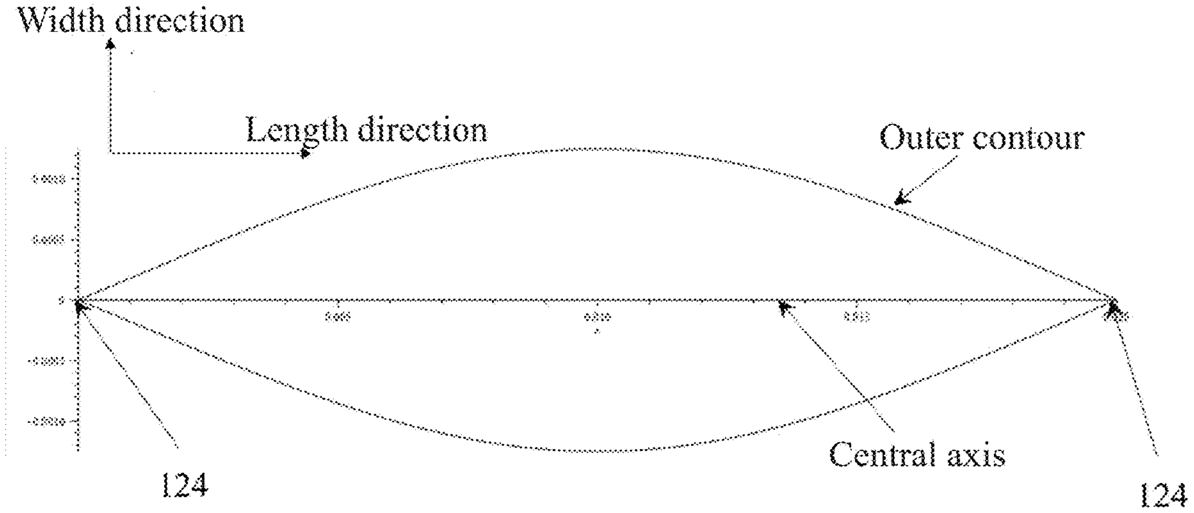
FIG. 17C is a schematic diagram illustrating a shape of a first-order electrode corresponding to an equivalent rectangle with a beam fixed at both ends according to some embodiments of the present disclosure.

FIG. 17A is a schematic diagram illustrating an exemplary two-dimensional electrode including discrete electrode units 134 according to some embodiments of the present disclosure; FIG. 17B is a schematic diagram illustrating an exemplary discrete electrode unit 134 of a two-dimensional electrode 130 according to some embodiments of the present disclosure; FIG. 17C is a schematic diagram illustrating a shape of a first-order electrode 130-1 corresponding to an equivalent rectangle with a beam fixed at both ends according to some embodiments of the present disclosure.

As shown in FIG. 17A, the piezoelectric component 120 may be divided into 16 rectangles (divided by 15 dashed lines) in the length direction (as shown in the horizontal direction in FIG. 17A), wherein each of the 16 rectangles takes the width of the piezoelectric component 120 as the length and equally divides the length of the piezoelectric component 120; similarly, the piezoelectric component 120 is further divided into 8 rectangles (divided by 7 dashed lines) in the width direction (as shown in the vertical direction in FIG. 17A). 16 rectangles in the length direction and 8 rectangles in the width direction may be equivalent to fixed beams at both ends. As shown in FIG. 7, along the length direction, the width of the rectangular fixed beam from one fixed region 124 to other fixed region 124 gradually increases from 0 and then gradually decreases to 0, forming a "shuttle shape". In some embodiments, the increase or decrease of the width may include one or any combination of a gradient increase or decrease, a linear increase or decrease, a curvilinear increase or decrease of the width, or the like. It should be understood that FIG. 17C only shows the shape of the electrode in the length direction, and each rectangular fixed beam in the width direction may have a similar shape. In some embodiments, a first shape 171 (e.g., the shuttle shape in column 16 of FIG. 17A) of the plurality of discrete electrode units 134 in the length direction and a second shape 172 (e.g., the shuttle shape in row 8 of FIG. 17A) of the plurality of discrete electrode units 134 in the width direction may be determined based on the shape of the first-order electrode 130-1 shown in FIG. 17C, so that the two-dimensional electrode 130 is determined based on the first shape 171 and the second shape 172. As shown in FIG. 17B, the two-dimensional electrode 130 may be a coinciding region of the first shape 171 and the second shape 172, and each coinciding region may be a discrete electrode unit 134.

Figure 18:
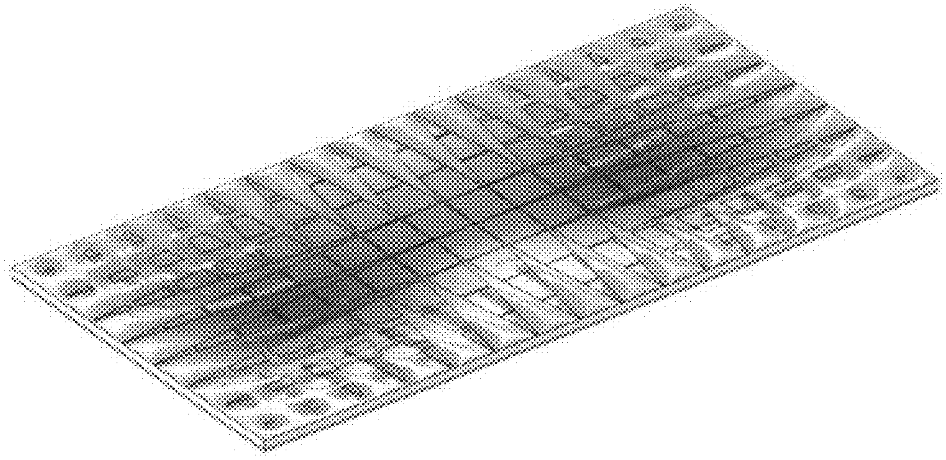
FIG. 18 is a vibration mode of a piezoelectric component covered with a two-dimensional electrode shown in FIG. 17B according to some embodiments of the present disclosure.

FIG. 18 is a vibration mode of a piezoelectric component 120 covered with a two-dimensional electrode 130 shown in FIG. 17B according to some embodiments of the present disclosure.

As shown in FIG. 18, the vibration mode of the piezoelectric component 120 covered by the two-dimensional electrode 130 shown in FIG. 17B at a high frequency band (e.g., 18326 Hz) is still close to the first-order vibration mode, so that the sound pressure may be effectively output and the sound pressure level amplitude in the vibration output region may be significantly increased. Compared with the two-dimensional electrode (the vibration mode shown in FIGS. 16C and 16D) shown in FIG. 14C, the two-dimensional electrode 130 shown in FIG. 17B may be configured to realize the modal control.

In some embodiments, the discrete electrode units may have a problem of difficult circuit connection between the electrodes, which result in difficulty in mass production. Therefore, the electrodes may be changed from discrete to connected, which is conducive to the production of printing screens and the connection of electrodes, and is suitable for mass production. For example, the electrode 130 may include two-dimensional distributed continuous electrodes 135, and the continuous electrodes may include a plurality of hollow regions 136.

In some embodiments, the continuous electrode 135 may be configured as a continuous conductive material disposed on the surface of the piezoelectric component 120, and the hollow region 136 may be configured as a region where no conductive material is disposed. Compared with the plurality of discrete electrode units 134 shown in FIG. 14A-14D or 17B, the continuous electrode 135 may be understood as the electrode 130 formed by connecting the discrete distributed electrodes as a whole, and then the continuous electrode 135 may be dispersed into a plurality of regions of two-dimensional distribution by providing a plurality of hollow regions 136, thereby realizing the design of the electrode 130.

Figure 19A:
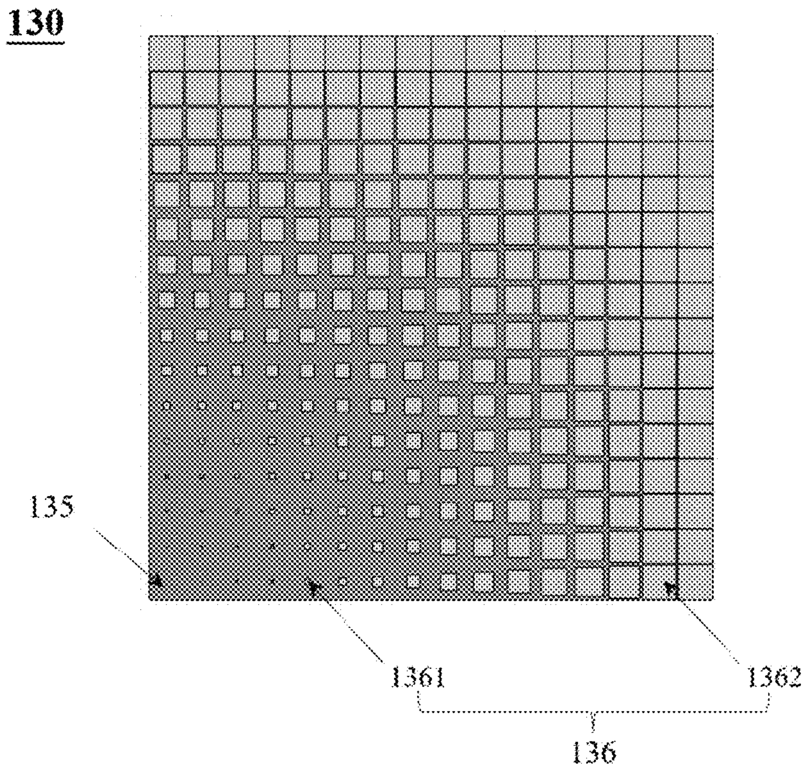
FIG. 19A is a schematic diagram illustrating a partial structure of an exemplary continuous electrode distributed in two dimensions according to some embodiments of the present disclosure.
Figure 19B:
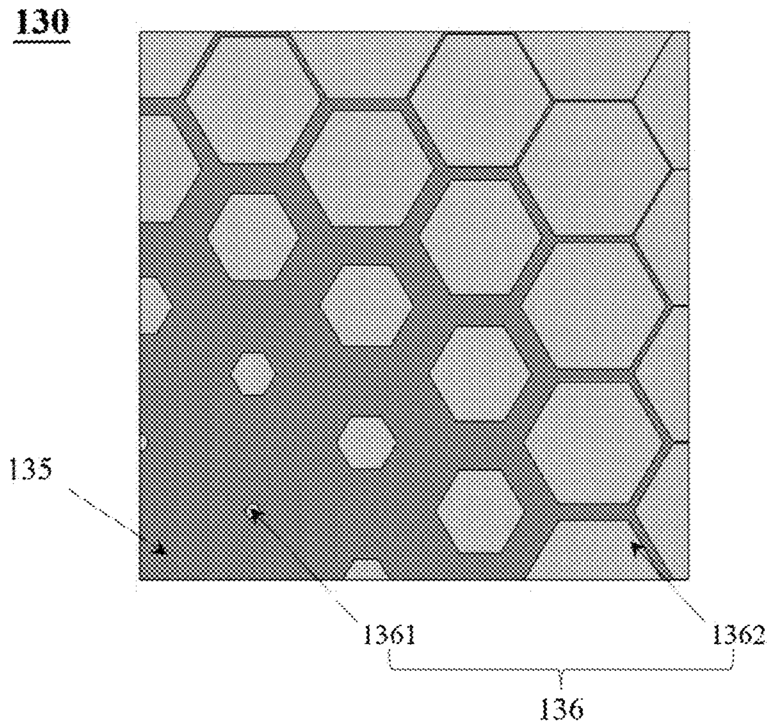
FIG. 19B is a schematic diagram illustrating a partial structure of an exemplary continuous electrode distributed in two dimensions according to some embodiments of the present disclosure.
Figure 19C:
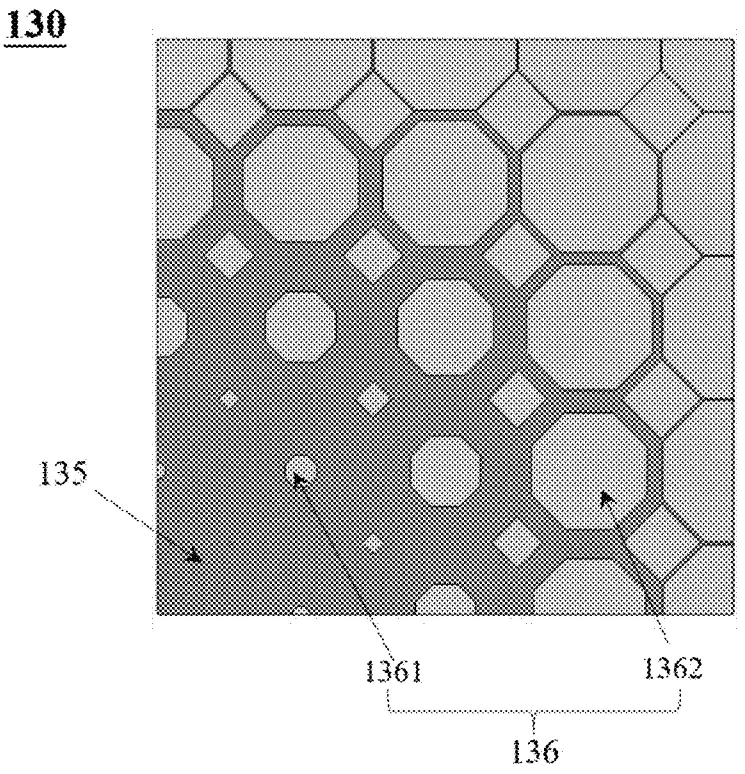
FIG. 19C is a schematic diagram illustrating a partial structure of an exemplary continuous electrode distributed in two dimensions according to some embodiments of the present disclosure.

FIG. 19A is a schematic diagram illustrating a partial structure of an exemplary continuous electrode 130 distributed in two dimensions according to some embodiments of the present disclosure; FIG. 19B is a schematic diagram illustrating a partial structure of an exemplary continuous electrode 130 distributed in two dimensions according to some embodiments of the present disclosure; FIG. 19C is a schematic diagram illustrating a partial structure of an exemplary continuous electrode 130 distributed in two dimensions according to some embodiments of the present disclosure.

As shown in FIGS. 19A-19C, the two-dimensional electrode 130 (a quarter of the two-dimensional electrode) may include two-dimensional distributed continuous electrodes 135, and the continuous electrodes 135 may include a plurality of hollow regions 136.

In some embodiments, the shape of the hollow region 136 may or may not be the same as the shape of the piezoelectric component 120. In some embodiments, the shape of the hollow region 136 may include one or any combination of a circle, a triangle, a quadrangle, a pentagon, a hexagon, or an irregular shape. For example, the continuous electrode 135 shown in FIG. 19A may include a plurality of square hollow regions 136; the continuous electrode 135 shown in FIG. 19B may include a plurality of hexagonal hollow regions 136; the continuous electrode 135 shown in FIG. 19C may include a plurality of quadrilateral hollow regions and a plurality of octagonal hollow regions.

In some embodiments, the gap between two adjacent hollow regions 136 at the center of the piezoelectric layer 122 may be greater than the gap between two adjacent hollow regions 136 at the boundary of the piezoelectric layer. For example, as shown in FIGS. 19A-19C, the gap between two adjacent hollow regions 136 is less as the boundary is closer.

In some embodiments, the area of the first hollow region 1361 at the center of the piezoelectric layer 122 may be less than the area of the second hollow region 1362 at the boundary of the piezoelectric layer. As shown in FIGS. 19A-19C, the first hollow region 1361 is closer to the center of the piezoelectric layer 122 than the second hollow region 1362, and the area of the first hollow region 1361 is less than the area of the second hollow region 1362.

In some embodiments, the piezoelectric layer 122 may be divided into a plurality of two-dimensional distributed piezoelectric sub-regions of a same size, each piezoelectric sub-region may include a hollow region 136, and the hollow region 136 may be located at the center of the piezoelectric sub-region, and the continuous electrode 135 in the piezoelectric sub-region may be located at the edge of the piezoelectric sub-region, forming a continuous electrode with the continuous electrode 135 of other piezoelectric sub-regions. For example, as shown in FIGS. 19A-19C, the hollow region 136 may be disposed at the center of the piezoelectric sub-region so that the electrodes 130 at the edges of the piezoelectric region are continuous.

Figure 20:
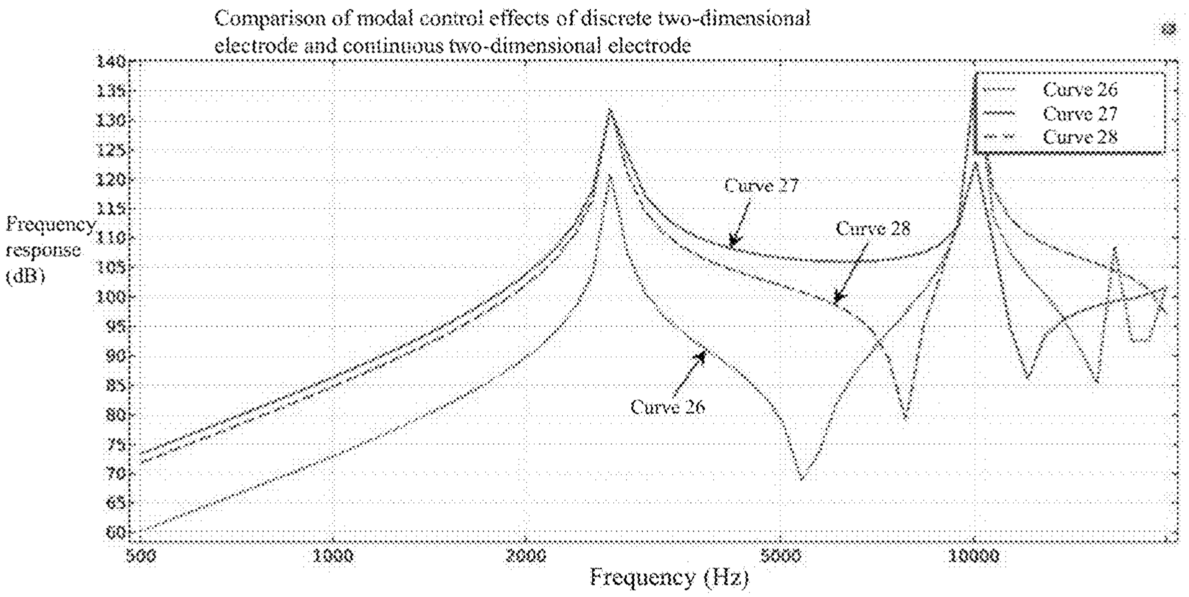
FIG. 20 is a schematic diagram illustrating a comparison of frequency response curves of exemplary piezoelectric components according to some embodiments of the present disclosure.

In some embodiments, an area of the hollow region 136 may be related to the vibration displacement value of the piezoelectric sub-region where the hollow region 136 is located at a specific frequency (e.g., a first-order peak and a second-order peak). In some embodiments, the area of the hollow region 136 in each piezoelectric sub-region may be determined according to the difference (e.g., the vibration displacement ratio) between the vibration displacement value of the piezoelectric sub-region and the maximum displacement value of the piezoelectric layer 122 at a specific frequency (e.g., the first-order peak and the second-order peak). For example, the greater the difference between the vibration displacement value and the maximum displacement value of the piezoelectric layer 122, the greater the area of the hollow region 136. FIG. 20 is schematic diagram illustrating a comparison of frequency response curves of exemplary piezoelectric components according to some embodiments of the present disclosure.

As shown in FIG. 20, curve 26 is a frequency response curve of the piezoelectric component 120 using the integral electrode, curve 28 is a frequency response curve of the piezoelectric component 120 covered with the two-dimensional electrode 130 with 32×32 discrete electrode units, and curve 27 is a frequency response curve of the piezoelectric component 120 covered with 32×32 continuous electrodes 130 distributed in two dimensions. According to the curve 27 and the curve 28, the modal control effect of the two-dimensional distributed continuous electrode 130 is different from that of the electrode 130 composed of the two-dimensional distributed discrete electrode units. For example, the resonance valley at 12128 Hz of the electrode 130 composed of two-dimensional distributed discrete electrode units moves forward to 7829.4 Hz. The forward movement of the resonance valley may be related to the hollow shape and density of the electrodes 130, but it still shows a certain modal control effect on the piezoelectric component 120.

In some embodiments, the continuous electrode 135 includes the plurality of hollow regions 136, so that the covering surface of the two-dimensional electrode 130 can be changed from discrete to connected, which may be conducive to the generation, production, and use of the two-dimensional electrode, and may be suitable for mass production.

It should be understood that similar to the one-dimensional electrode, in the design of the two-dimensional electrode, the effective area of the electrode that is covered on the piezoelectric layer may also be defined by the shape and area of the piezoelectric region of the piezoelectric layer (e.g., piezoelectric plate, piezoelectric film). For example, the piezoelectric plate or the piezoelectric film may include the piezoelectric region made of the piezoelectric material and the non-piezoelectric region made of the non-piezoelectric material. The sum of the areas of the piezoelectric region and the non-piezoelectric region may be equal to the coverage area of the piezoelectric plate or the piezoelectric film on the substrate, and the electrode is completely covered on the piezoelectric plate or the piezoelectric film (that is, the electrode and the piezoelectric plate or the piezoelectric film coincide). The pattern of the piezoelectric region may be a two-dimensional electrode design pattern shown in any one of the FIG. 14A, 14B, 14C, 14D, 17A, 17B, 19A, 19B, or 19C, and the portion of the substrate other than the piezoelectric region may be a non-piezoelectric region. Therefore, in the two-dimensional electrode design, the modal control of the piezoelectric component may be realized by the area of the piezoelectric region<the coverage area of the piezoelectric layer (e.g., piezoelectric plate, piezoelectric film) =the coverage area of the electrode≤the surface area of the substrate covered with the piezoelectric layer.

In some embodiments, the electrode 130 may be covered on one surface of the piezoelectric layer 122 or both surfaces of the piezoelectric layer 122. For example, the electrode 130 may be also covered on the other surface opposite the above surface, and the covered area of the electrode 130 on the other surface may be less than or equal to the area of the surface. That is, the design of the electrode 130 may be realized on two opposite surfaces, thereby controlling the modality of the piezoelectric component 120. The design of the electrode 130 on the other surface may refer to the design of any of the electrodes 130 in FIGS. 5A, 5C, 8A-8D, 11A, 11B, 14A-14D, 17B, 19A-19C, which is not repeated here.

In some embodiments, the piezoelectric component 120 may also include a vibration control component, wherein the vibration control component may be configured as a device that changes the vibration state of the acoustic device (e.g., adjusts the vibration mode of the output by changing the mass, elasticity, or damping of one or more components within the acoustic device). In some embodiments, the vibration control component may be connected to the vibration output region 123 of the piezoelectric component 120 and adjust the vibration output by the piezoelectric component 120. In some embodiments, the vibration control component may include one or any combination of a connector (e.g., a housing), a mass (e.g., a metal mass), an elastic member (e.g., a traction rope, a spring piece, or the like). The connector may connect the piezoelectric component 120 with other components, and the elastic member may provide an elastic force to the piezoelectric component 120, thereby changing the vibration state of the piezoelectric component 120.

In some embodiments, the vibration control component may include a mass 170, and the mass 170 may be physically (e.g., mechanically or electromagnetically) connected to the vibration output region 123. In some embodiments, the mass 170 may be a component having a certain mass. In some embodiments, the mass 170 may include one or any combination of a metal mass, a rubber mass, a plastic mass, or the like. In some embodiments, the mass 170 may be configured to change the modality of the piezoelectric component 120.

In some embodiments, the acoustic device 100 may further include a connector 171 that connects the vibration component 110 and the piezoelectric component 120. In some embodiments, the connector 171 may be configured as a component having a certain rigidity, and the connector 171 may include one or any combination of the vibration plate, the elastic member, or the like. In some embodiments, the mass 170 may be connected to the vibration output region 132 through the connector 171.

The following takes the piezoelectric component 120 shown in FIG. 3 as an example to provide an exemplary acoustic device, and describe in detail the specific implementation of the piezoelectric cantilever beam, the mass 170, and the connector 171.

Figure 21:
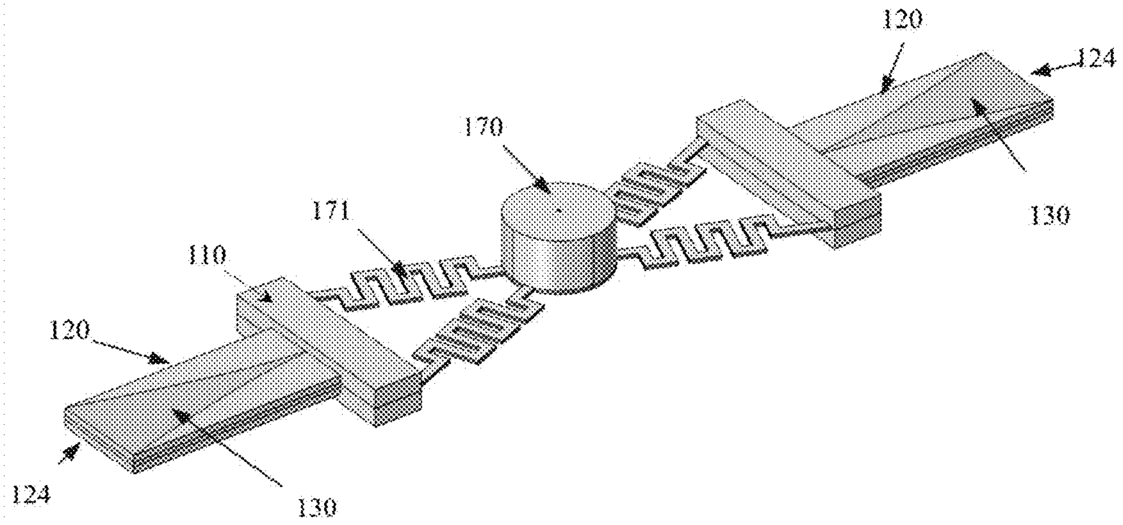
FIG. 21 is a schematic diagram illustrating an exemplary acoustic device according to some embodiments of the present disclosure.

FIG. 21 is a schematic diagram illustrating an exemplary structure of an acoustic device according to some embodiments of the present disclosure. In some embodiments, the acoustic device may include at least one piezoelectric component 120, the vibration output region of each piezoelectric component 120 may be connected to one vibration component 110, and each vibration component 110 may be connected to the vibration control component (e.g., a mass 170). As shown in FIG. 21, the acoustic device may include two piezoelectric components 120 covered with a first-order electrode 130-1. The vibration output region of each piezoelectric component 120 may be connected to the vibration component 110, and the vibration component 110 and the vibration control component (e.g., the mass 170) may be connected through at least one connector 171.

In some embodiments, the length of the piezoelectric component 120 in the acoustic device may be shortened to reduce the mode of the piezoelectric component 120. For example, the acoustic device may use the elasticity provided by the connector 171 and the mass 170 to construct a low-frequency peak, so as to use a short piezoelectric cantilever beam (e.g., the piezoelectric component 120 shown in FIG. 21) to reduce the mode, and form a flat frequency response curve between the low-frequency peak and the first-order vibration mode peak (higher frequency) of the frequency response curve.

Figure 22:
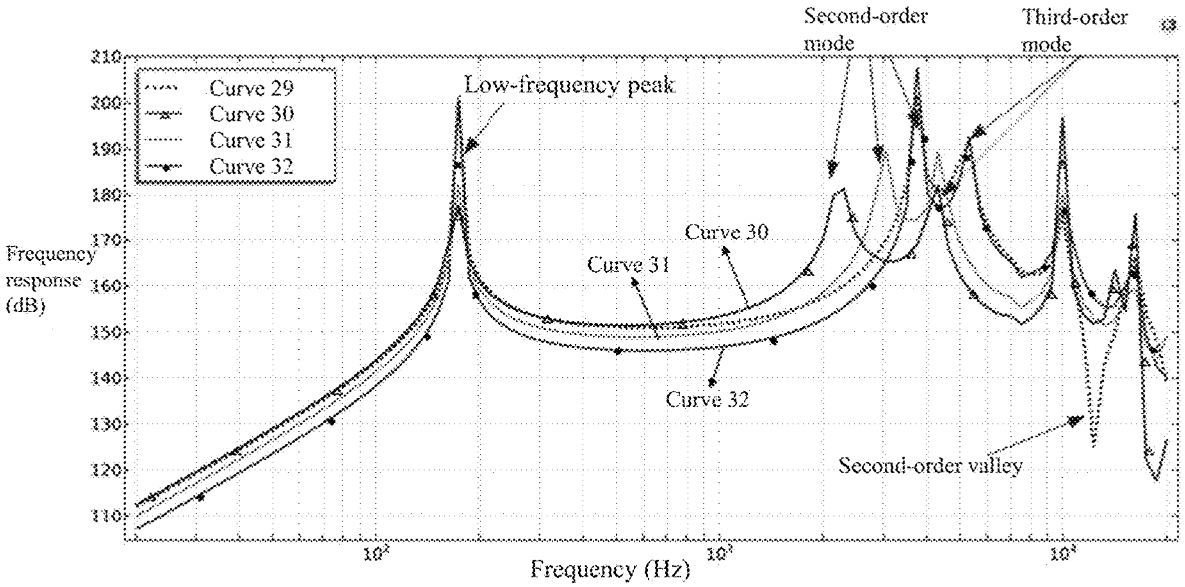
FIG. 22 is a schematic diagram illustrating a comparison of frequency response curves of exemplary piezoelectric components according to some embodiments of the present disclosure.

FIG. 22 is a schematic diagram illustrating a comparison of frequency response curves of exemplary piezoelectric components according to some embodiments of the present disclosure.

As shown in FIG. 22, curve 29 is a frequency response curve of piezoelectric component 120 using an integral electrode with a length of 8 mm; curve 30 is a frequency response curve of piezoelectric component 120 using a first-order electrode 130-1 with a length of 8 mm; curve 31 is a frequency response curve of the piezoelectric component 120 using a first-order electrode 130-1 with a length of 10 mm; curve 32 is a frequency response curve of the piezoelectric component 120 using the first-order electrode 130-1 with a length of 12 mm.

As shown in FIG. 22, the frequency response curve corresponding to the piezoelectric component 120 shown in curve 29 generates a second-order resonance at the second-order vibration mode valley (e.g., 12272 Hz), which may reflect that the piezoelectric component 120 using the integral electrode in the acoustic device may not effectively output vibration, resulting in a resonance valley on its frequency response curve. The resonance valley of the frequency response curve corresponding to the piezoelectric component 120 shown in curve 30-curve 32 is raised, and the vibration characteristics of the resonance valley are not affected, which may reflect that the designing of the first-order electrode 130-1 in the acoustic device may improve the second-order resonance valley produced by the piezoelectric component 120.

Moreover, the frequency response curve corresponding to the piezoelectric component 120 shown in curve 30-curve 32 shows that the mode formed by the piezoelectric cantilever beam (i.e., the piezoelectric component 120) and the vibration plate moves forward, which may reflect in the design of the first-order electrode 130-1 in the acoustic device, appropriately extending the length of the piezoelectric component 120 (for example, the length of the piezoelectric component 120 may be set to be no less than 8 mm, no less than 10 mm, or no less than 12 mm), which may improve the sensitivity of the acoustic device in the middle and low frequencies while enhancing the resonance valley.

Figure 23A:
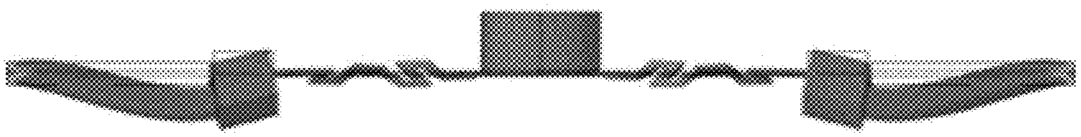
FIG. 23A is a vibration mode illustrating an acoustic device using an integral electrode according to some embodiments of the present disclosure.
Figure 23B:
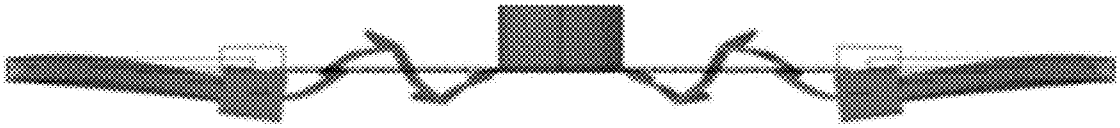
FIG. 23B is a vibration mode illustrating an acoustic device using a first-order electrode according to some embodiments of the present disclosure.

FIG. 23A is a vibration mode illustrating an acoustic device using an integral electrode 130 according to some embodiments of the present disclosure; FIG. 23B is a vibration mode illustrating an acoustic device using a first-order electrode 130-1 according to some embodiments of the present disclosure.

As shown in FIG. 23A, at the resonance valley (e.g., at 12272 Hz), the vibration output region of the piezoelectric component 120 forms a node in the acoustic device using the integral electrode. As shown in FIG. 23B, at the resonance valley (e.g., 12272 Hz), the vibration output region of the piezoelectric component 120 of the acoustic device using the first-order electrode 130-1 does not form a node and presents a first-order vibration mode.

In the embodiments provided in the present disclosure, the designing of the electrode 130 may improve the second-order resonance valley generated by the frequency response curve corresponding to the piezoelectric component 120 in the acoustic device, and at the same time, a longer piezoelectric component 120 may be configured to improve the sensitivity of the acoustic device at medium and low frequencies.

Figure 24:
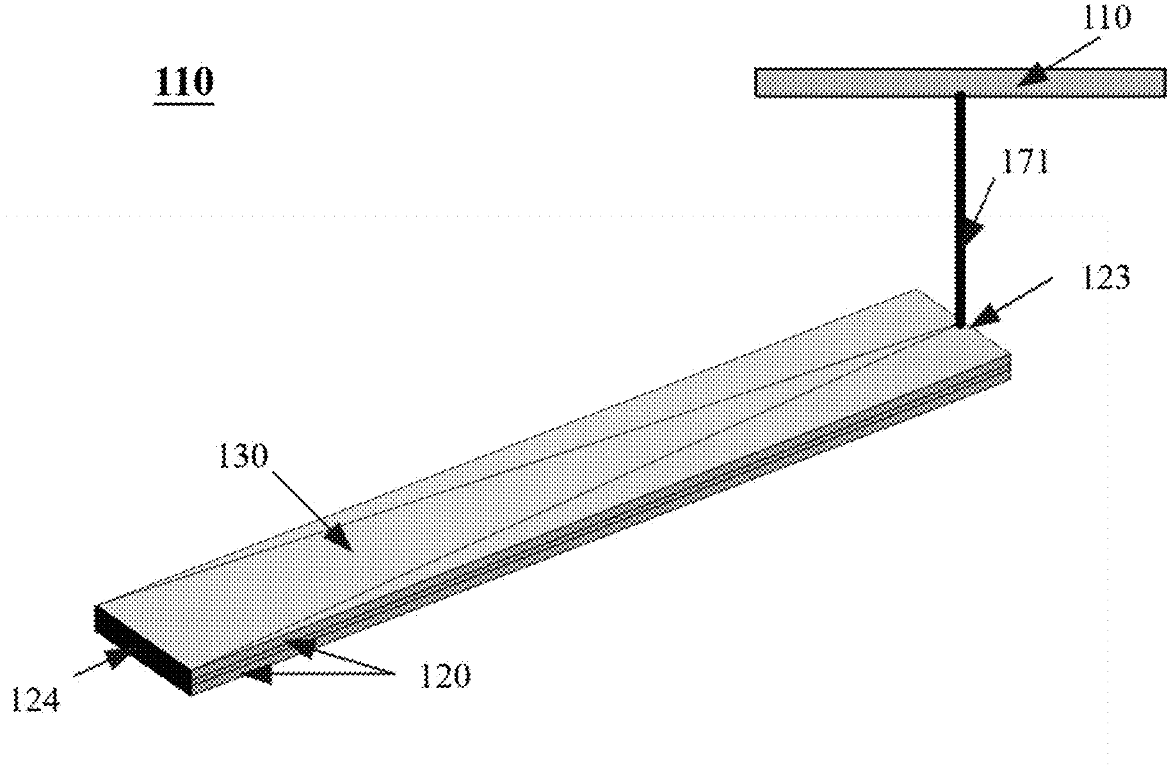
FIG. 24 is a schematic diagram illustrating an exemplary acoustic device according to some embodiments of the present disclosure.

FIG. 24 is a schematic diagram illustrating an exemplary acoustic device according to some embodiments of the present disclosure.

In some embodiments, as shown in FIG. 24, the acoustic device 100 may shape the output of the piezoelectric cantilever beam. One end of the piezoelectric cantilever beam (i.e., the piezoelectric component 120) adopting the electrode design may be the fixed region 124, and the other end may be the vibration output region 123, and the vibration may be output to the vibrating plate or vibrating film (i.e., the vibrating component 110) through the connector 171. In some embodiments, the acoustic device 100 may be a bone conduction audio device (e.g., a bone conduction earphone, a bone conduction glasses, or the like). In some embodiments, the fixed end of the piezoelectric component 120 may include one or any combination of a shell, an ear hook vertex, a connection between the ear hook and a plate cartridge, and a glasses frame of the bone conduction audio device. In some embodiments, the connector 171 may have a certain rigidity and be rigidly connected to the vibration output region of the vibrating plate or vibrating film and the vibration output region of the piezoelectric cantilever beam.

The beneficial effects that the embodiments of the present disclosure may bring include but are not limited to: (1) the modal actuator of the piezoelectric component may be formed by designing the electrode, so that the piezoelectric component only generates the excitation force of the specific mode to output the specific vibration mode, thereby avoiding the vibration output point of the piezoelectric component from forming a node, and improving the working reliability of the acoustic device. (2) Compared with the modal control system composed of adding mechanical structures such as the spring, the mass, and the damping in a specific region, the embodiments of the present disclosure may realize the modal control of the piezoelectric component based on the electrode designing and simplify the structure of the acoustic device.

The basic concepts have been described above, apparently, for those skilled in the art, the above-mentioned detailed disclosure is only used as an example, and it does not constitute a limitation of the present disclosure. Although it is not explicitly stated here, those skilled in the art may make various modifications, improvements and amendments to the present disclosure. These types of modifications, improvements, and amendments are recommended in the present disclosure, so these types of modifications, improvements, and amendments remain in the spirit and scope of the exemplary embodiment of the present disclosure.

Meanwhile, the present disclosure uses specific words to describe the embodiments of the present disclosure. For example, "one embodiment," "an embodiment," and/or "some embodiments" mean that a certain feature, structure, or characteristic is connected with at least one embodiment of the present disclosure. Therefore, it should be emphasized and noted that "one embodiment" or "an embodiment" or "an alternative embodiment" mentioned twice or more in different positions in the present disclosure does not necessarily refer to the same embodiment. Furthermore, certain features, structures, or characteristics of one or more embodiments of the present disclosure may be combined as appropriate.

Furthermore, unless explicitly stated in the claims, the order of processing elements and sequences described in this present disclosure, the use of alphanumerics, or the use of other names is not intended to limit the order of the processes and methods of this present disclosure. While the foregoing disclosure discusses by way of various examples some embodiments of the invention presently believed to be useful, it is to be understood that such details are provided for purposes of illustration only and that the appended claims are not limited to the disclosed embodiments, on the contrary, the claims are intended to cover all modifications and equivalent combinations that come within the spirit and scope of the embodiments of this present disclosure. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure and aiding in the understanding of one or more of the various embodiments. However, this disclosure method does not mean that the characteristics required by the object of this description are more than the characteristics mentioned in the claims. Rather, claimed subject matter may lie in less than all features of a single foregoing disclosed embodiment.

In some embodiments, numbers expressing quantities of ingredients, properties, and so forth, used to describe and claim certain embodiments of the application are to be understood as being modified in some instances by the term "about," "approximate," or "substantially". For example, "about," "approximate," or "substantially" may indicate ±20% variation of the value it describes, unless otherwise stated. Correspondingly, in some embodiments, the numerical parameters used in the description and claims are approximate values, and the approximate values may be changed according to the required characteristics of individual embodiments. In some embodiments, the numerical parameter should consider the prescribed effective digits and adopt a general digit retention method. Although the numerical ranges and parameters used to confirm the breadth of the range in some embodiments of the present disclosure are approximate values, in specific embodiments, settings of such numerical values are as accurate as possible within a feasible range.

For each patent, patent application, patent application publication, or other materials cited in the present disclosure, such as articles, books, specifications, publications, documents, or the like, the entire contents of which are hereby incorporated into the present disclosure as a reference. Except for the application history documentation of the present specification or conflict, there is also an except for documents (currently or after the present specification) in the widest range of documents (currently or later). It should be noted that if there is any inconsistency or conflict between the description, definition, and/or use of terms in the auxiliary materials of the present disclosure and the content of the present disclosure, the description, definition, and/or use of terms in the present disclosure is subject to the present disclosure.

Finally, it should be understood that the embodiments described herein are only used to illustrate the principles of the embodiments of the present disclosure. Other variations may also fall within the scope of the present disclosure. Thus, as an example, an alternative configuration of the embodiments of the present disclosure may be regarded as consistent with the teachings of the present disclosure. Accordingly, the embodiments of the present disclosure are not limited to the embodiments explicitly introduced and described by the present disclosure.

What is claimed is:

1. An acoustic device, comprising:

a piezoelectric component, wherein the piezoelectric component generates vibration under an action of a driving voltage;

an electrode, wherein the electrode provides the driving voltage for the piezoelectric component; and a vibration component, wherein the vibration component is physically connected to the piezoelectric component to receive the vibration and generate sound, wherein the piezoelectric component includes:

a substrate; and a piezoelectric layer, wherein the piezoelectric layer is covered on a surface of the substrate, the electrode is covered on a surface of the piezoelectric layer, and a coverage area of the electrode on the surface of the piezoelectric layer is less than an area of the surface of the substrate covered with the piezoelectric layer; wherein the piezoelectric layer is divided into at least one piezoelectric region and at least one non-piezoelectric region, the at least one piezoelectric region is made of a piezoelectric material, the at least one non-piezoelectric region is made of a non-piezoelectric material, and an area of the piezoelectric layer is equal to a sum of an area of the at least one piezoelectric region and an area of the at least one non-piezoelectric region.

2. The acoustic device of claim 1, further comprising a mass block, wherein the piezoelectric component includes a vibration output region and a fixed region, wherein the vibration output region is connected to the mass block, and the electrode is designed according to a mass ratio of a mass of the mass block to a mass of the piezoelectric component.

3. The acoustic device of claim 2, wherein a width of the electrode gradually decreases from the fixed region to the vibration output region.

4. The acoustic device of claim 2, wherein the electrode includes two electrode envelope regions, and opposite potentials are input into the two electrode envelope regions.

5. The acoustic device of claim 4, wherein a transition point exists between the two electrode envelope regions, and a width of the electrode in a first electrode envelope region of the two electrode envelope regions gradually decreases from the fixed region to the transition point.

6. The acoustic device of claim 5, wherein the width of the electrode in a second electrode envelope region of the two electrode envelope regions increases firstly and then decreases from the transition point to the vibration output region.

7. The acoustic device of claim 3, wherein the width of the electrode in the fixed region is equal to a width of the fixed region.

8. The acoustic device of claim 3, wherein the width of the electrode in the vibration output region is 0.

9. The acoustic device of claim 1, wherein the at least one piezoelectric region and the electrode coincide.

10. The acoustic device of claim 1, wherein the piezoelectric layer and the electrode coincide.

11. The acoustic device of claim 1, wherein the piezoelectric layer includes a piezoelectric plate or a piezoelectric film.

12. The acoustic device of claim 11, wherein the electrode includes a plurality of discrete electrode units distributed in two dimensions.

13. The acoustic device of claim 12, wherein among the plurality of discrete electrode units, a gap between two adjacent discrete electrode units at a center of the piezoelectric layer is less than a gap between two adjacent discrete electrode units at a boundary of the piezoelectric layer.

14. The acoustic device of claim 12, wherein an area of a first discrete electrode unit at a center of the piezoelectric layer is greater than an area of a second discrete electrode unit at a boundary of the piezoelectric layer.

15. The acoustic device of claim 11, wherein the electrode includes a continuous electrode distributed in two dimensions, and the continuous electrode includes a plurality of hollow regions.

16. The acoustic device of claim 15, wherein an area of a first hollow region at a center of the piezoelectric layer is less than an area of a second hollow region at a boundary of the piezoelectric layer.

17. The acoustic device of claim 1, wherein the electrode is also covered on a second surface opposite to the surface of the piezoelectric layer, and a coverage area of the electrode on the second surface is less than or equal to an area of the surface.

18. The acoustic device of claim 1, wherein a coverage area of the electrode is equal to a coverage area of the at least one piezoelectric region, the coverage area of the electrode is less than a coverage area of the piezoelectric layer, and the coverage area of the piezoelectric layer is equal to a surface area of the substrate that covers the piezoelectric layer.

19. An acoustic device, comprising:

a piezoelectric component, wherein the piezoelectric component generates vibration under an action of a driving voltage;

an electrode, wherein the electrode provides the driving voltage for the piezoelectric component; and a vibration component, wherein the vibration component is physically connected to the piezoelectric component to receive the vibration and generates sound, wherein the piezoelectric component comprises:

a substrate; and a piezoelectric layer, wherein the piezoelectric layer is covered on a surface of the substrate, the piezoelectric layer is divided into at least one piezoelectric region and at least one non-piezoelectric region, wherein the electrode is covered on a surface of the piezoelectric layer;

the substrate, the piezoelectric layer, and the electrode coincide respectively; and a coverage area of the at least one piezoelectric region on the substrate is less than a coverage area of the piezoelectric layer on the substrate; wherein the piezoelectric layer is divided into at least one piezoelectric region and at least one non-piezoelectric region, the at least one piezoelectric region is made of a piezoelectric material, the at least one non-piezoelectric region is made of a non-piezoelectric material, and an area of the piezoelectric layer is equal to a sum of an area of the at least one piezoelectric region and an area of the at least one non-piezoelectric region.

* * * * *